United States Patent
Fukuoka et al.

(10) Patent No.: US 8,933,376 B2
(45) Date of Patent: Jan. 13, 2015

(54) HEATING DEVICE, COATING AND DEVELOPING SYSTEM, HEATING METHOD AND STORAGE MEDIUM

(75) Inventors: Tetsuo Fukuoka, Koshi (JP); Takahiro Kitano, Koshi (JP); Kazuo Terada, Koshi (JP)

(73) Assignee: Tokyo Electron Limited, Tokyo-to (JP)

( * ) Notice: Subject to any disclaimer, the term of this patent is extended or adjusted under 35 U.S.C. 154(b) by 1657 days.

(21) Appl. No.: 12/015,191

(22) Filed: Jan. 16, 2008

(65) Prior Publication Data
US 2008/0169279 A1     Jul. 17, 2008

(30) Foreign Application Priority Data
Jan. 17, 2007   (JP) ................. 2007-008400

(51) Int. Cl.
A21B 1/00      (2006.01)
F27B 17/00    (2006.01)
H01L 21/67    (2006.01)

(52) U.S. Cl.
CPC ...... *F27B 17/0025* (2013.01); *H01L 21/67109* (2013.01); *H01L 21/67115* (2013.01); *H01L 21/67248* (2013.01)
USPC ...................................... 219/405

(58) Field of Classification Search
USPC ........... 118/724, 725; 219/411, 444.1, 446.1; 392/416, 418
See application file for complete search history.

(56) References Cited

U.S. PATENT DOCUMENTS

| 4,717,645 | A | * | 1/1988 | Kato et al. | 430/296 |
| 5,051,338 | A | * | 9/1991 | Kato et al. | 430/296 |
| 5,059,770 | A | * | 10/1991 | Mahawili | 219/391 |
| 5,551,985 | A | * | 9/1996 | Brors et al. | 118/725 |
| 5,834,737 | A | * | 11/1998 | Hirose et al. | 219/385 |
| 6,104,002 | A | * | 8/2000 | Hirose et al. | 219/390 |
| 6,402,509 | B1 | * | 6/2002 | Ookura et al. | 432/253 |
| 6,474,986 | B2 | * | 11/2002 | Oda et al. | 432/247 |
| 6,478,578 | B2 | * | 11/2002 | Choi et al. | 432/253 |
| 6,501,191 | B2 | * | 12/2002 | Tanaka et al. | 219/390 |
| 6,515,731 | B1 | * | 2/2003 | Akimoto | 355/27 |
| 6,744,020 | B2 | * | 6/2004 | Shirakawa et al. | 219/494 |
| 7,060,939 | B2 | * | 6/2006 | Shinya et al. | 219/390 |
| 7,094,994 | B2 | * | 8/2006 | Oyama et al. | 219/444.1 |

FOREIGN PATENT DOCUMENTS

JP   7-183291   7/1995
JP   10-256170  9/1998

* cited by examiner

*Primary Examiner* — Dana Ross
*Assistant Examiner* — Renee L Miller
(74) *Attorney, Agent, or Firm* — Oblon, Spivak, McClelland, Maier & Neustadt, L.L.P.

(57) ABSTRACT

A heating device has a heating chamber 3. An initial temperature distribution is created in a surface of a substrate (wafer W) when the substrate is carried into the heating chamber 3 . . . Temperature distribution creating means (heating lamps 2) creates a preheating temperature distribution in the substrate supported on a cooling plate 4 at a waiting position before the substrate is carried into the heating chamber 3 so as to level out the initial temperature distribution.

23 Claims, 16 Drawing Sheets

HEATING DEVICE, COATING AND DEVELOPING SYSTEM, HEATING METHOD AND STORAGE MEDIUM

BACKGROUND OF THE INVENTION

1. Field of the Invention

The present invention relates to a heating device for heating a substrate coated with a film, such as a resist film, a heating method, a coating and developing system using the heating device, and a storage medium storing a computer program specifying steps of the heating method.

2. Description of the Related Art

A coating and developing system is used as a resist pattern forming system for forming a resist pattern on a semiconductor wafer (hereinafter, referred to simply as "wafer") or a glass substrate for a LCD (liquid crystal display). The coating and developing system coats a wafer with a resist film, and develops a resist pattern after the wafer has been processed by an exposure process. The coating and developing system is internally provided with a heating device called a baking device. The heating device heats a wafer coated with a resist solution film to vaporize a solvent contained in the resist solution film to form a dry resist film on the wafer.

For example, when a resist film of a chemically amplified resist solution is exposed, an acid is produced in the resist film. The acid is diffused in the resist film by a heating process called a postexposure baking process (PEB process). Then, the wafer is cooled by a cooling process to stop the diffusion of the acid to form pats soluble in a developer and those insoluble in the developer in the resist film. It is possible that the width of lines forming the developed resist pattern becomes irregular unless the wafer is processed by the PEB process and the cooling process in a satisfactory intrasurface uniformity.

The coating and developing system is provided with a main arm for carrying a wafer in the coating and developing system, and the heating device is provided with a special arm having a cooling function to carry a wafer to and from a heating chamber of the heating device. The special arm places a wafer on a heating plate placed in the heating chamber. The special arm takes up a wafer processed by the heating process and can uniformly cool the wafer. Consequently, an accurate resist pattern can be formed.

The heating device of this type needs lifting pins and a lifting mechanism for lifting the lifting pins to transfer a wafer between the special arm and the heating plates, and to ensure a clearance for a transfer operation. Therefore, the heating device cannot be formed in a low height. Thus the heating device places a restriction on forming the coating and developing system in a layered structure to improve throughput. Time needed for transferring a wafer between the special arm and the heating plate is an overhead, namely, time that does not directly contribute to the heating process, causing the reduction of throughput.

To solve such a problem in the conventional heating device, the inventors of the present invention developed a heating device including a heating chamber, a cooling plate disposed in front of the heating chamber, and a wire for carrying a wafer between the cooling plate and the heating chamber. FIG. 16 is a typical cross sectional view of the interior of such a heating device 100. The heating device 100 is internally provided with a heating chamber 101 having the shape of a flat box provided with an opening 101a in its side wall, and a cooling plate 105 disposed in front of the heating chamber 101. The cooling plate 105 cools a wafer W processed by a heating process.

A wafer W carried into the heating device 100 is placed on the cooling plate 105 by an external wafer carrying mechanism as shown in FIG. 16A. The cooling plate 105 is provided with, for example, two grooves 105a extending in a direction perpendicular to a carrying direction in which the wafer W is carried. Two wires 104A and 104B are extended in the grooves 105a, respectively. The cooling plate 105 is lowered to transfer the wafer W to the wires 104A and 104B. A moving mechanism, not shown, interlocked with a wire-holding part holding the wires 104A and 104B moves the wires 104A and 104B to carry the wafer W through the opening 101a into the heating chamber 101.

The interior of the heating chamber 101 is heated beforehand by heating plates 102A and 102B disposed on and beneath the heating chamber 101, respectively. As shown in FIG. 16B, a hot gas is blown by a gas blowing device 103a, and the hot gas is sucked by an exhaust device 103b to produce a unidirectional flow of the hot gas. Thus the wafer W not placed in contact with the heating plate is heated. The wafer W thus heated is moved in the reverse direction toward the cooling plate 105, and is placed on the cooling plate 105 to cool the wafer W is cooled rapidly to stop changes in a resist film formed on the wafer W. The wafer W thus cooled is sent out from the heating device 100.

The heating device 100 of this type developed by the inventors of the present invention subjects the wafer W supported on the wires 104A and 104B to the heating process. Therefore, any operations like those needed by the conventional heating device for transferring a wafer W between the special arm and the heating plate are not necessary. Consequently, overhead time can be curtailed to prevent the reduction of throughput.

In this heating device 100, the wafer W is carried horizontally in a carrying direction into the heating chamber 101 heated beforehand. Therefore, there is a time difference in the range of about 1 to about 3 s between the time the front end, with respect to the carrying direction, of the wafer W enters the heating chamber 101 and the time the rear end, with respect to the carrying direction, of the wafer W enters the heating chamber 101. Consequently, there is an initial temperature distribution in the surface of the wafer W immediately after the wafer W has been completely inserted into the heating chamber 101, in which a temperature difference between the front and the rear end of the surface of the wafer W is, for example, about 3° C.

When the wafer W having the surface in which temperature is distributed in such an initial temperature distribution is processed by the PEB process, It is possible that parts of the resist film respectively corresponding to the front and the rear end of the wafer W are heated differently and, for example, lines of parts of a resist pattern respectively corresponding to the front and the rear end of the wafer W are formed in different widths, respectively.

Heating devices mentioned in Paragraph 0053 of JP-A H7-183291 (Cited reference 1) and in Paragraphs 0019 to 0021 of JP-A H100256170 (Cited reference 2) use heating lamps for heating a wafer. A technique mentioned in Cited reference 1 is intended for heating a substrate with heating lamps to prevent dew condensation in a heating chamber. A technique mentioned in Cited reference 2 is intended for improving the efficiency of heating a substrate with heating lamps. Thus those previously proposed techniques are different from the present invention intended to solve the foregoing problem resulting from the initial temperature distribution, and neither of those techniques is not applicable to solving the problem intended to be solved by the present invention.

SUMMARY OF THE INVENTION

The present invention has been made in view of such circumstances and it is therefore an object of the present invention to provide a heating device capable of reducing the effect of an initial temperature distribution in which temperature is distributed in a surface of a substrate when the substrate is carried into the heating chamber thereof, and of processing the surface of the substrate by a heating process in a high intrasurface uniformity, a coating and developing system provided with the heating device, a heating method, and a storage medium storing a program specifying the steps of the heating method.

A heating device according to the present invention includes: a heating chamber contained in a processing vessel, and provided with heating plates for heating a substrate; a carrying means for transversely carrying a substrate placed at a waiting position into the heating chamber in the processing vessel; and a temperature distribution creating means for creating a preheating temperature distribution for leveling out an initial temperature distribution occurring in a surface of the substrate when the substrate is carried into the heating chamber.

The term, "leveling out an initial temperature distribution" signifies narrowing the range of temperature distribution in the surface of the substrate.

The temperature distribution creating means may create a preheating temperature distribution by heating lamps or a luminous intensity distribution control member disposed between an array of heating lamps and the waiting position by heating a substrate such that parts of the wafer nearer to the rear end, with respect to a carrying direction in which the substrate is carried into the heating chamber, of the substrate are higher than those of parts nearer to the front end, with respect to the carrying direction, of the substrate. The heating device may further include a substrate support plate at the waiting position in front of the heating chamber with respect to a carrying direction in which the substrate is carried into the heating chamber, and a temperature distribution creating means, such as a resistance heating element, may be incorporated into the substrate support plate.

The heating device may further include a substrate support plate at the waiting position behind the heating chamber with respect to the carrying direction in which the substrate is carried into the heating chamber, and a temperature distribution creating means capable of cooling a front end part, with respect to a carrying direction in which the substrate is carried into the heating chamber, of the substrate such that the temperature of a rear end part, with respect to a carrying direction in which the substrate is carried into the heating chamber, of the substrate is higher than that of the front end part of the substrate may be incorporated into the substrate support plate.

A cooling plate for cooling the substrate processed by the heating process and carried out from the heating chamber may be disposed at the waiting position or the substrate support plate may have a cooling function of a cooling plate. Preferably, the carrying means include a plurality of wires extended so as to intersect a carrying passage parallel to the carrying direction or so as to be parallel to the carrying passage.

A coating and developing system according to the present invention includes: a carrier block to which a carrier containing substrates is delivered; a processing block including a coating module for coating a surface of a substrate taken out of the carrier with a chemically amplified resist, a heating module for processing the substrate processed by an exposure process by a heating process, and a developing module for processing the substrate processed by the heating process by a developing process; and an interface block through which the substrate is transferred between the processing block and an exposure system; wherein the heating module is provided with the heating device of the present invention.

A heating method according to the present invention includes: a heating step of heating a substrate by heating plates in a heating chamber formed in a processing vessel; a carrying step of transversely carrying the substrate placed at a waiting position in a carrying direction into the heating chamber; and a preheating temperature distribution creating step of creating a preheating temperature distribution in a surface of the substrate placed at the waiting position so as to level out an initial temperature distribution that occurs in the surface of the substrate immediately after the substrate has been carried into the heating chamber.

In the preheating temperature distribution creating step, a rear end part, with respect to the carrying direction in which the substrate is carried into the heating chamber, of the substrate may be heated by, for example, heating lamps to create the preheating temperature distribution in which the temperature of the rear end part is higher than that of a front end part of the substrate. The heating method may include controlling luminous intensity distribution in the surface of the substrate at a position between the heating lamps and the waiting position. A support plate for supporting the substrate thereon may be disposed behind the heating chamber with respect to the carrying direction in which the substrate is carried into the heating chamber, and the preheating temperature distribution may be created by heating means incorporated into the support plate.

The preheating temperature distribution creating step may cool a front end part, with respect to the carrying direction in which the substrate is carried into the heating chamber, of the substrate by cooling means incorporated in a support plate disposed at the waiting position where the substrate is kept waiting such that a preheating temperature distribution in which the temperature of the rear end part is higher than that of the front end part.

The heating method further includes a cooling step of cooling the substrate processed by the heating process and carried out of the heating chamber. Preferably, the cooling step is executed at the waiting position. Preferably, the carrying step of carrying the substrate into the heating chamber is achieved by a plurality of wires extended so as to intersect a carrying passage parallel to the carrying direction or so as to be parallel to the carrying passage.

A storage medium according to the present invention stores a computer program to be executed by a heating device for heating a substrate by heating plates; wherein the computer program specifies the steps of the heating method.

According to the present invention the substrate having the surface in which the preheating temperature distribution is created is carried into the heating chamber, and then the heating process for heating the entire substrate is started. Therefore, the range of the initial temperature distribution resulting from the temperature difference between the front and the rear end part of the substrate due to the difference between the time the front end part is inserted into the heating chamber and the time the rear end part is inserted into the heating chamber is narrowed, and hence the heating process can heat the substrate in high intrasurface uniformity. When the technique of the present invention is applied to a heating device that processes, for example, a chemically amplified resist film by a PEB process, a resist pattern of lines having a uniform width can be developed, which contributes to the improvement of the yield and quality of products.

DESCRIPTION OF THE PREFERRED EMBODIMENTS

Figure 1:
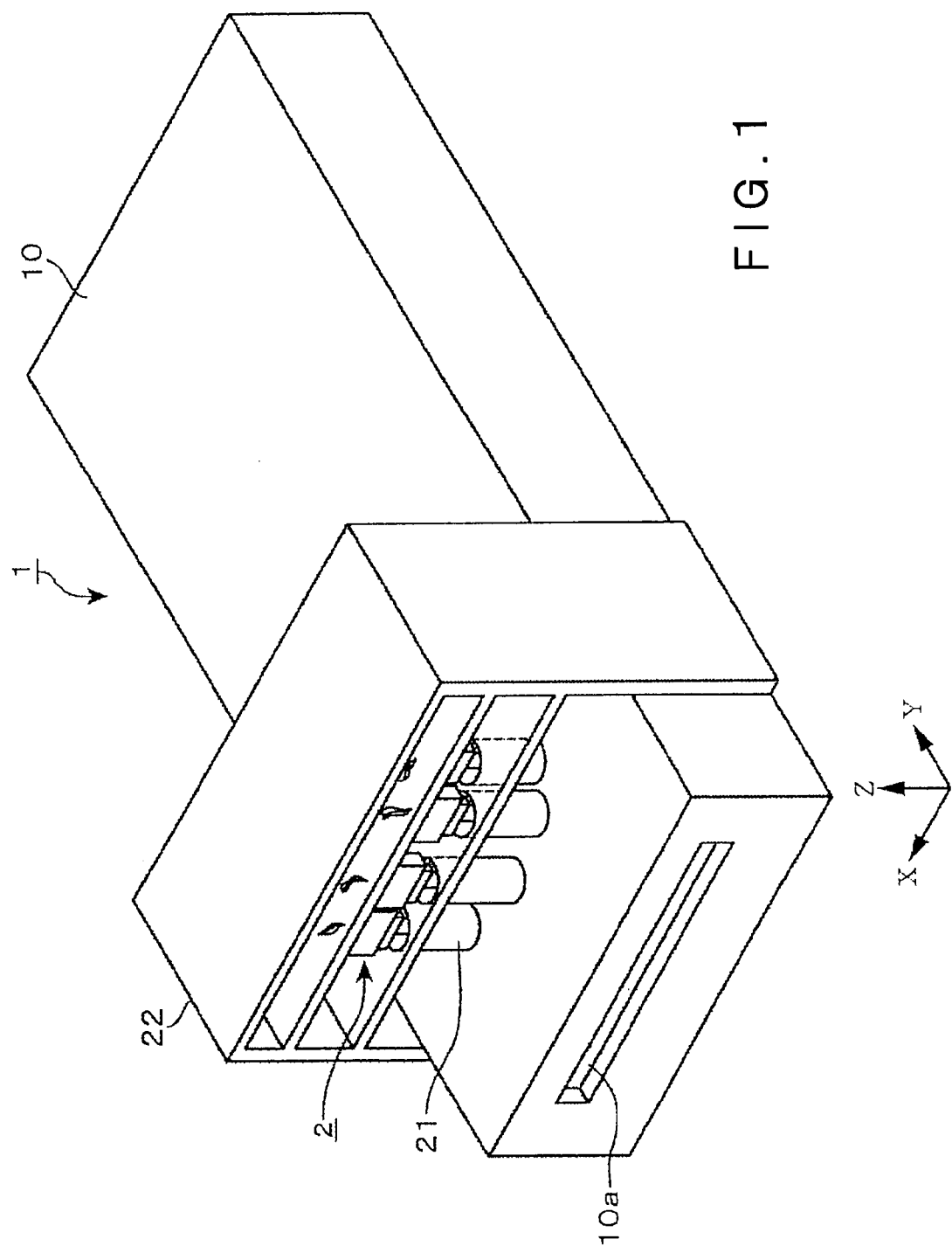
FIG. 1 is a perspective view of a heating device in a preferred embodiment according to the present invention.
Figure 2:
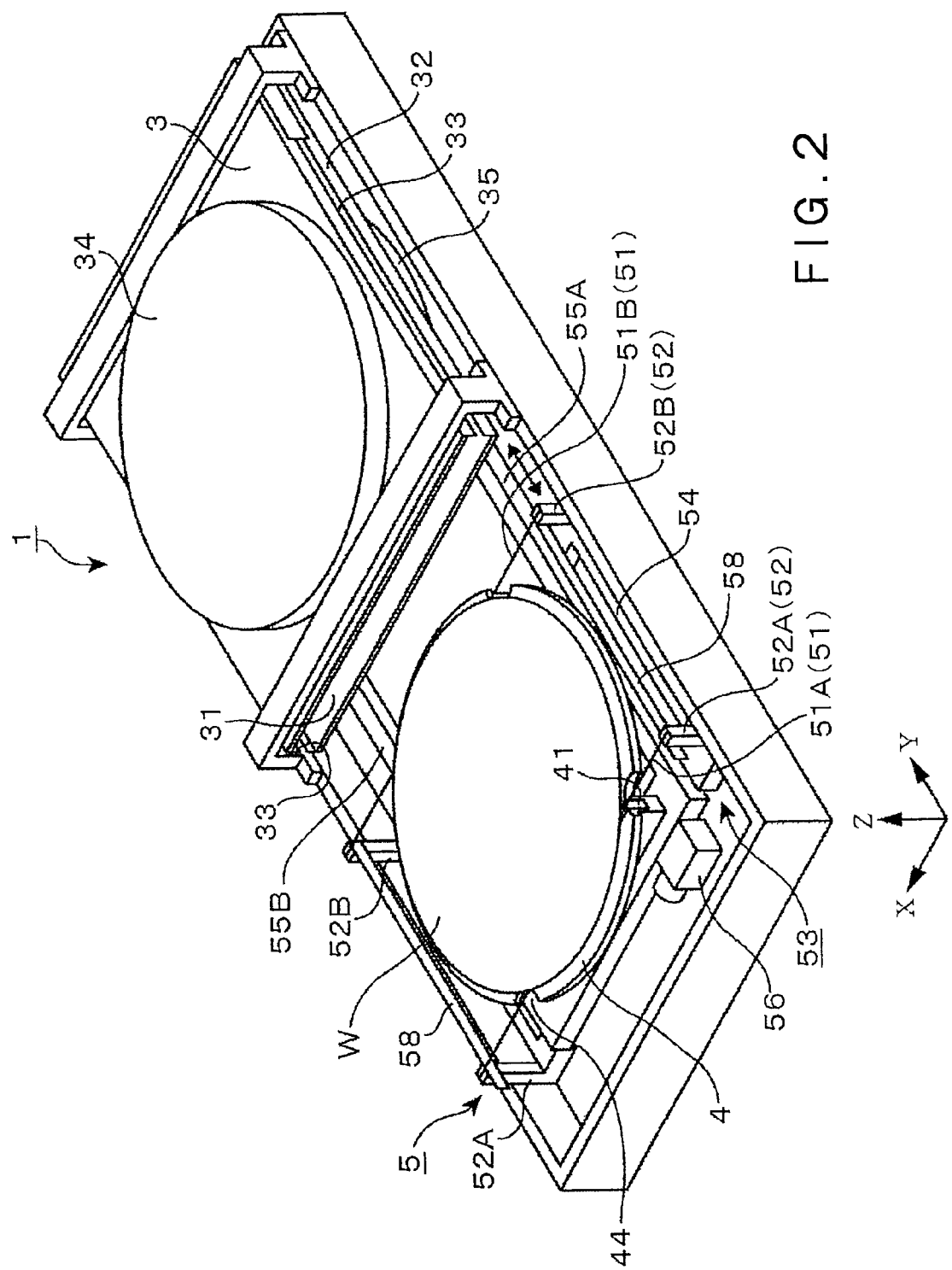
FIG. 2 is a perspective view showing the internal structure of the heating device shown in FIG. 1.

A heating device 1 in a preferred embodiment according to the present invention for carrying out a PEB process will be described with reference to FIGS. 1 to 7. FIG. 1 is a perspective view of the heating device 1, FIG. 2 is a perspective view showing the internal structure of the heating device 1, and FIG. 3 is a longitudinal sectional view of the heating device 1.

Referring to FIG. 1, the heating device 1 is contained in a box-shaped processing vessel 10 having one end wall provided with an entrance opening 10a through which a wafer W is carried into and out of the processing vessel 10. Heating lamps 2 are arranged on the top wall of the processing vessel 10. The heating lamps 2 serve as a temperature distribution creating means. In the following description, the side of the end wall provided with the entrance opening 10a of the processing vessel 10 will be referred to as a front side.

Figure 3:
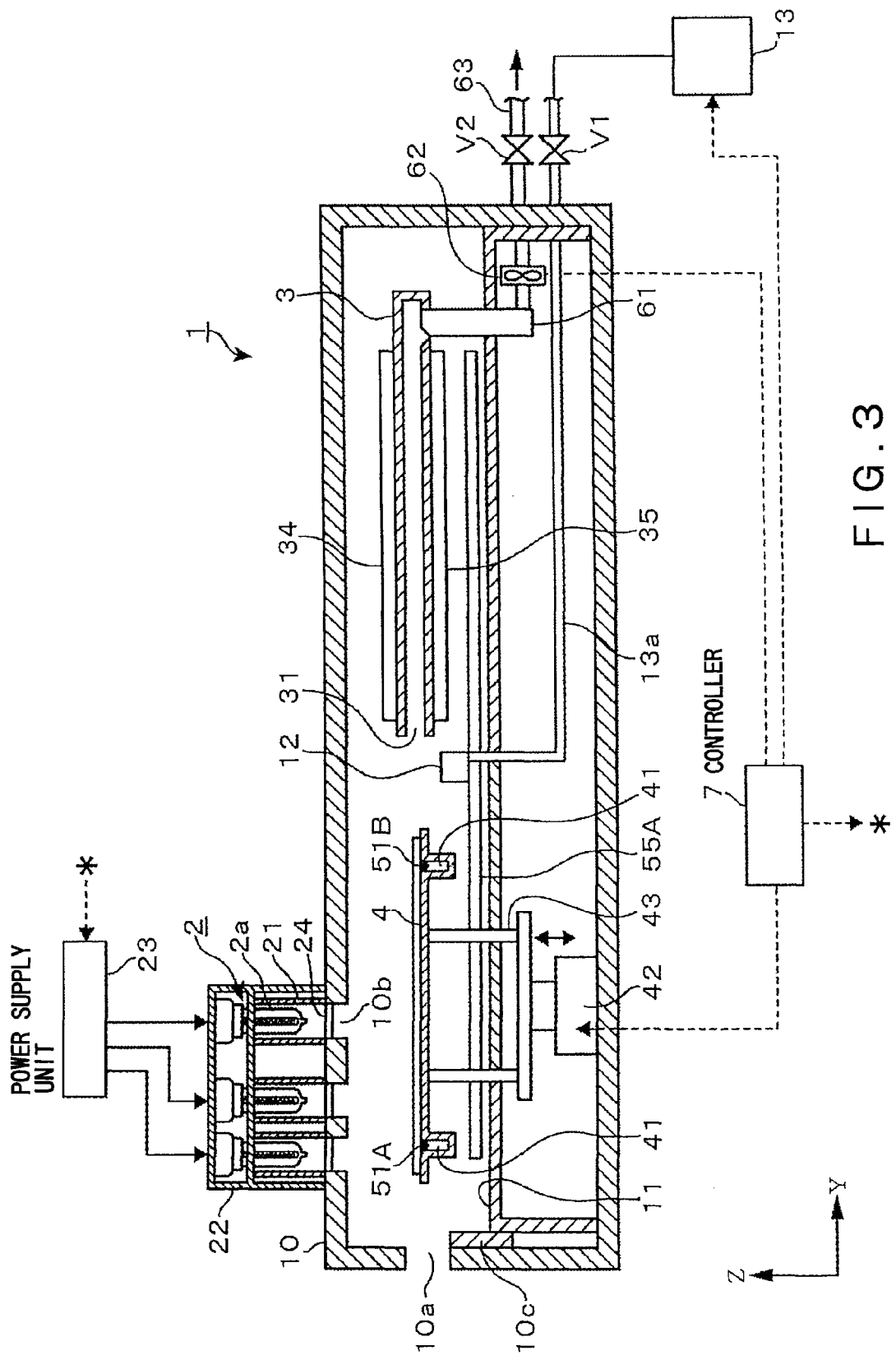
FIG. 3 is a longitudinal sectional view of the heating device shown in FIG. 1.

Referring to FIG. 3, the interior space of the processing vessel 10 of the heating device 1 is divided into an upper space and a lower space by a base 11. Disposed in the upper space in the processing vessel 10 are a flat heating chamber 3 for processing a wafer W by a heating process, a cooling plate 4 for holding a wafer W at a waiting position before the wafer W is processed by the heating process, and for cooling a wafer W after the wafer W has been processed by the heating process, and a carrying mechanism 5 for carrying a wafer W between the cooling plate 4 and the heating chamber 3. In FIG. 3, indicated at 10c is a shutter for closing the entrance opening 10a.

The construction of the cooling plate 4 will be described. The cooling plate 4 is a substantially circular disk of aluminum or the like having a diameter approximately equal to that of a 12 in. diameter wafer W. The cooling plate 4 excluding parts in which grooves, which will be described later, are formed has a thickness of about 4 mm. The cooling plate 4 is provided in its back surface with a cooling mechanism, not shown, using temperature-controlled water. The cooling plate 4 is capable of roughly cooling a wafer W placed thereon.

The construction of the carrying mechanism 5 will be described. The carrying mechanism 5 includes a plurality of wires 51, for example, two wires 51A and 51B, for supporting and carrying a wafer W, wire holding members 52, namely, wire holding members 52A and 52B, and a moving mechanism 53 for moving the wire holding members 52. The two wires 51A and 51B are extended in a direction, namely, in an X-direction in FIGS. 2 and 3, intersecting a carrying direction, namely, a Y-direction in FIGS. 2 and 3, in which a wafer W is carried. The wires 51 have, for example, a diameter of about 0.5 mm, and a length longer than the respective diameters of a wafer W and the cooling plate 4. Each of the wires 51 is made from heat-resistant materials, such as aramid filaments or silicon carbide filaments.

The wire holding members 52A are disposed opposite to each other with respect to the cooling plate 4, and the wire holding members 52B are disposed opposite to each other with respect to the cooling plate 4. The wires 51A and 51B are extended between the wire holding members 52A and between the wire holding members 52B, respectively. The wire holding members 52 are moved by the moving mechanism 53 to carry a wafer W between a position above the cooling plate 4 and a position in the heating chamber 3. Positions of the wires 51 on the side of the cooling plate 4 will be referred to as home positions.

The construction of the moving mechanism 53 will be roughly described. Base parts of the wire holding members 52 are fixed to, for example, common base members 54, respectively. A driving unit 56 drives the base members 54 to move the base members 54 along two guide rails 55A and 55B parallel to the carrying direction in which a wafer W is carried. Indicated at 58 are sealing plates for sealing gaps formed in the heating chamber to move the wires 51 therein to prevent air from leaking out from the heating chamber 3.

Figure 4:
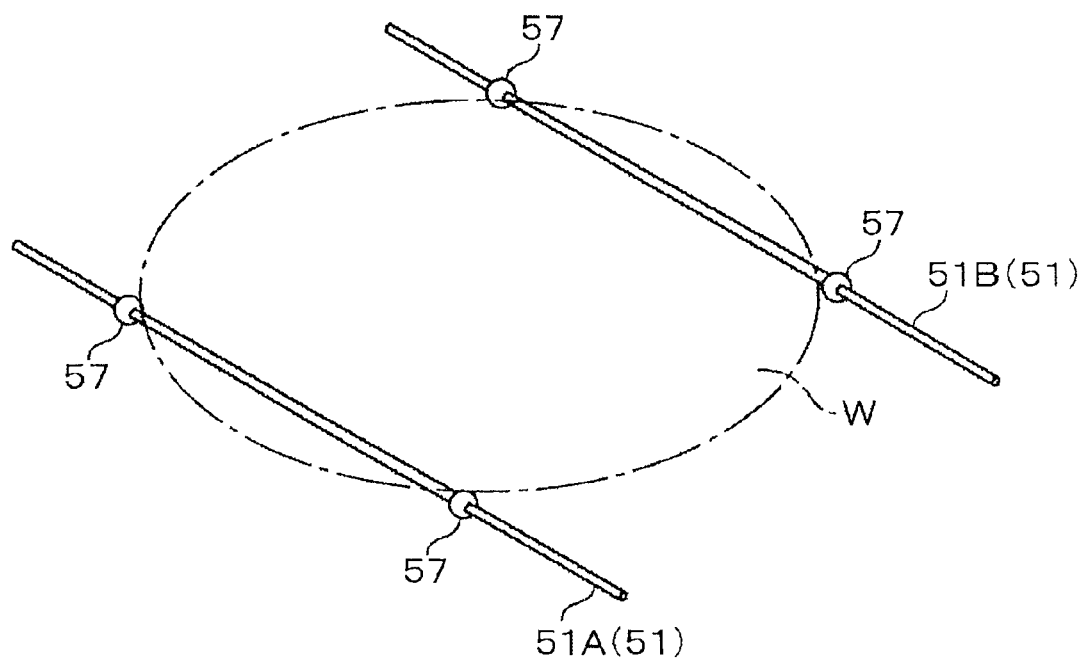
FIG. 4 is a perspective view of a wafer carrying mechanism.

As shown in FIG. 4, the wires 51 are provided with beads 57 for positioning a wafer W on the wires 51. For example, each of the wires 51A and 51B is provided with the two beads 57. The four beads 57 come into contact with the circumference of a wafer W to position the wafer W on the wires 51 and to prevent the dislocation of the wafer W while the wafer W is being carried. In the drawings excluding FIG. 4, the beads 57 are not shown for the sake of convenience.

Referring to FIGS. 2 and 3, the cooling plate 4 is provided with grooves 41, and the wires 51 are extended through the grooves 41, respectively. The grooves 41 are extended at positions corresponding to the respective home positions of the wires 51 so as to intersect the carrying direction in which a wafer W is carried. The grooves 41 are formed in a width sufficient to receive the beads 57 attached to the wires 51.

As shown in FIG. 3, a lifting mechanism 42 is disposed under the base 11 lying under the cooling plate 4. The lifting mechanism 42 includes, for example, a plurality of support pins 43. The lifting mechanism 42 lifts up the support pins 43 so as to project vertically upward through openings formed in the base 11.

The lifting mechanism 42 moves the cooling plate 42 vertically relative to the wires 51 to receive the wires 51 in the grooves 41 or to let the wires 51 extend outside the grooves 41. Thus a wafer W is transferred between the wires 51 and the cooling plate 4. Indicated at 44 in FIG. 4 are notches formed in the cooling plate 4 to enable support members projecting from the inside edge of a U-shaped arm included in a wafer carrying mechanism to move between the upper and the lower side of the cooling plate 4 without interfering with the cooling plate 4.

The construction of the heating chamber 3 will be described. The heating chamber 3 is provided in its front end wall facing the cooling plate 4 with an opening 31 through which a wafer W is carried into and carried out of the heating chamber 3. The opening has a width, namely, a vertical dimension, of 6 mm or below. The heating chamber 3 has an interior space greater than a wafer W. As shown in FIG. 3, the heating chamber 3 is made of a heat-conducting material, such as aluminum (Al) or a stainless steel sheet of about 3 mm in thickness. The heating chamber 3 has a U-shaped longitudinal section. As shown in FIG. 2, slots 33 of, for example, about 3 mm in width are formed in the side walls 32 on the sides of the opposite ends of the opening 31, respectively. The wires 51 extended between the wire holding members 52 can move through the slots 33.

Referring to FIGS. 2 and 3, heating plates 34 and 35 of aluminum nitride (AlN) or silicon carbide (SiC) are disposed contiguously with the upper and the lower wall, respectively, of the heating chamber 3 to heat the interior of the heating chamber 3. The heating plates 34 and 35 have the shape of a circular disk of a size substantially equal to that of a wafer W. The heating plates 34 and 35 are provided internally with, for example, resistance heating elements. The resistance heating elements are embedded in the heating plates 34 and 35, respectively.

Figure 5:
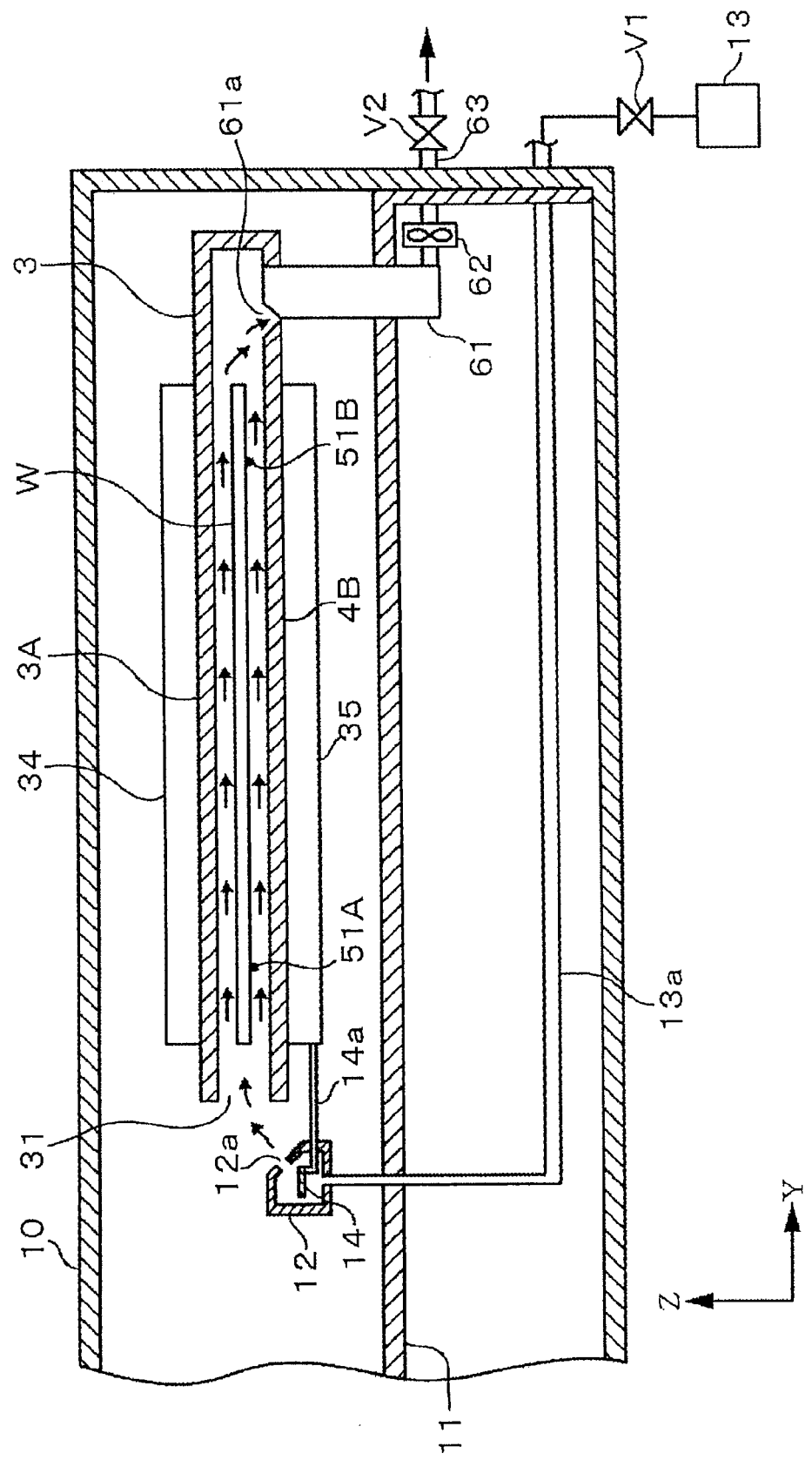
FIG. 5 is a longitudinal sectional view of assistance in explaining functions of a heating chamber of the heating device shown in FIG. 1.

As shown in FIG. 3, a gas blowing duct 12 is disposed at a position corresponding to a part of the base 11 on the front side of the heating chamber 3, and an exhaust duct 61 is disposed at a position corresponding to a part of the base 11 in the depth of the heating chamber 3. As shown in FIG. 5, the gas blowing duct 12 has an inclined wall facing the opening 31 of the heating chamber 3. The inclined wall is provided with, for example, a plurality of small discharge openings 12a. The discharge openings 12a are arranged at specific intervals along the width of the processing vessel 10 parallel to the X-direction in FIG. 2. The length of a range in which the discharge openings 12a are arranged is substantially equal to the diameter of a wafer W. As shown in FIG. 5, a heat-conducting plate 14 is placed inside the gas blowing duct 12 and is connected to the heating plate 35 by a heat pipe 14a. A gas heated by the heat-conducting plate 14 at a temperature equal to a temperature at which the surface of a wafer W is to be heated can be blown out.

The gas blowing duct 12 is connected to a gas source 13 placed, for example, outside the processing vessel 10 by a gas supply pipe 13a provided with a valve V1. The gas source 13 stores an inert gas, such as nitrogen gas, as a clean purging gas. The exhaust duct 61 is disposed opposite to the gas blowing duct 12 with respect to the lower heating plate 35 contiguous with the lower wall of the heating chamber 3. The exhaust duct 61 has an inclined wall facing the heating chamber 3. The inclined wall is provided with, for example, a plurality of small suction openings 61a. The suction openings 61a are arranged at specific intervals along the width of the heating chamber 3. The length of the exhaust duct 61 is substantially equal to the diameter of a wafer W. The exhaust duct 61 is connected to, for example, an exhaust line of a plant by an exhaust pipe 63 provided with a fan 62 and a valve V2. Suction rate at which the exhaust duct 61 sucks the atmosphere is regulated by regulating the operating speed of the fan 62 and the opening of the valve V2.

As shown in FIG. 3, the heating device 1 is provided with a controller 7 including, for example, a computer. The controller 7 is capable of controlling the operations of the lifting mechanism 42, the gas source 13, the fan 62 and such. To time a carrying operation for carrying a wafer W, operations for starting and stopping supplying the purging gas and necessary operations, the controller 7 reads a program specifying process parameters and processing procedures from a storage medium, not shown, and controls the components according to the program. The storage medium is, for example, a hard disk, a compact disk, a magnetooptical disk or a memory card.

As mentioned in connection with the description of the related art, an initial temperature distribution is created in a surface of a wafer W if the wafer W is carried simply into the heating chamber 3 of the heating device 1. The heating device 1 in this embodiment is provided with the heating lamps 2 as temperature distribution creating means for narrowing the range of the initial temperature distribution by creating a temperature distribution in a surface of a wafer W not yet processed by the heating process and held at the waiting position on the cooling plate 4. The heating lamps 2 will be described.

Referring to FIGS. 1 and 3, the plurality of heating lamps 2 are arranged on the top wall of the processing vessel 10 of the heating device 1 and are fixedly held on a fixed base 22. The heating lamps 2 are, for example, infrared lamps that radiate infrared rays or LEDs. The heating lamps 2 are fixed to the fixed base 22 opposite to the cooling plate 4 to radiate heat rays through openings 10b formed in the processing vessel 10 on a wafer W supported on the cooling plate 4. Heat radiating parts 2a of the heating lamps 2 are covered with cylindrical reflecting cases 21, respectively, to reflect heat rays toward the wafer W. The reflecting cases 21 have, for example, gold-plated reflecting surfaces, respectively. In FIG. 3, indicated at 24 are transparent plates fitted in the openings 10b. The transparent plates 24 are quartz glass plates or the like capable of transmitting heat rays radiated by the heating lamps 2. The transparent plates 24 serve also for preventing a wafer W from being contaminated with particles leaked into the processing vessel 10.

Figure 6:
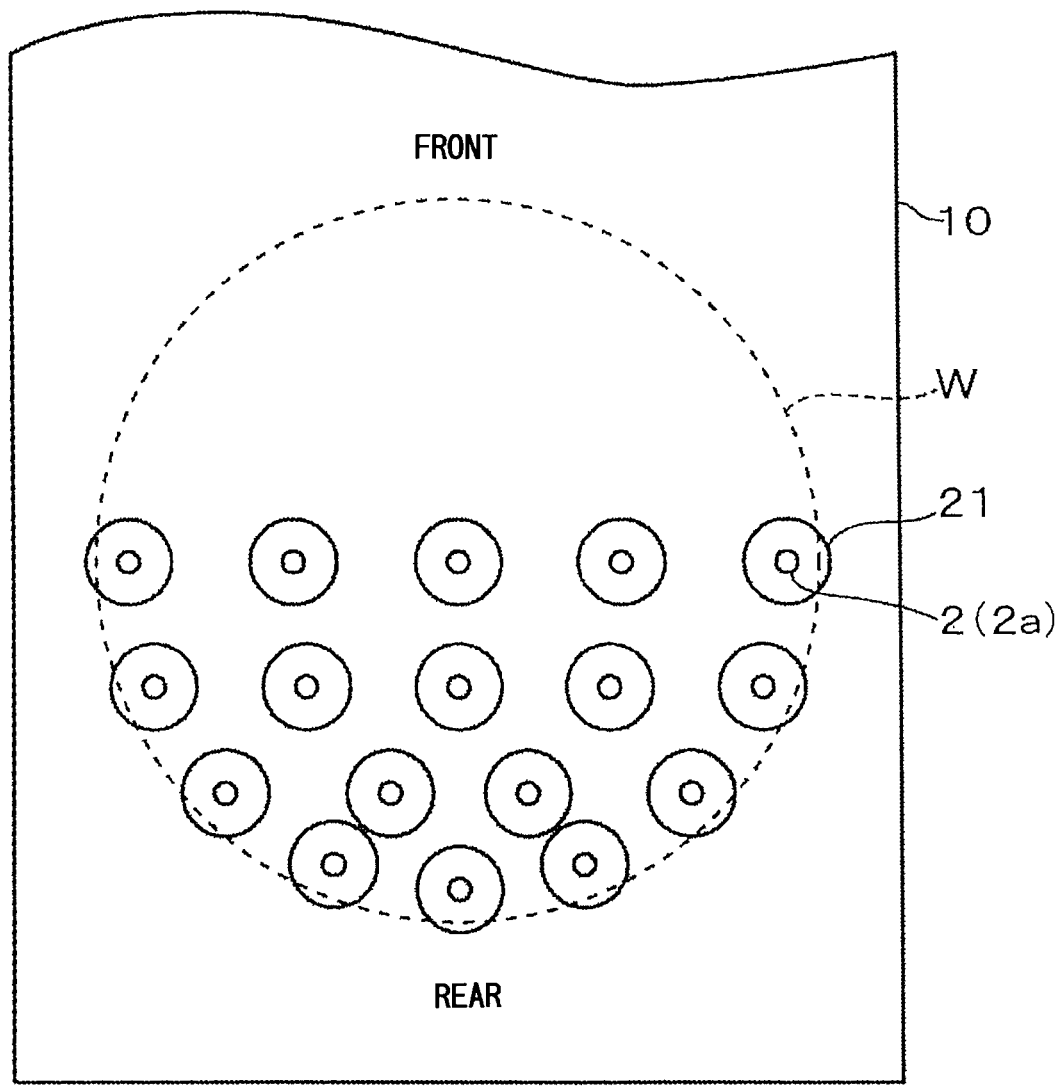
FIG. 6 is a plan view showing the arrangement of heating lamps as temperature distribution creating means.

The arrangement of the heating lamps 2 on the top wall of the processing vessel 10 will be described with reference to FIG. 6 typically showing an array of the heating lamps 2 on the top wall of the processing vessel 10 in a plan view. In FIG. 6, a dotted circle represents an image of a wafer W on the cooling plate 41 projected on the top wall of the processing vessel 10, the inner circle of a small double circle represents the heat radiating part 2a of the heating lamp 2, and the outer circle of the small double circle represents the reflecting case 21. The fixed base 22 and other associated parts are not shown for simplicity.

Figure 7:
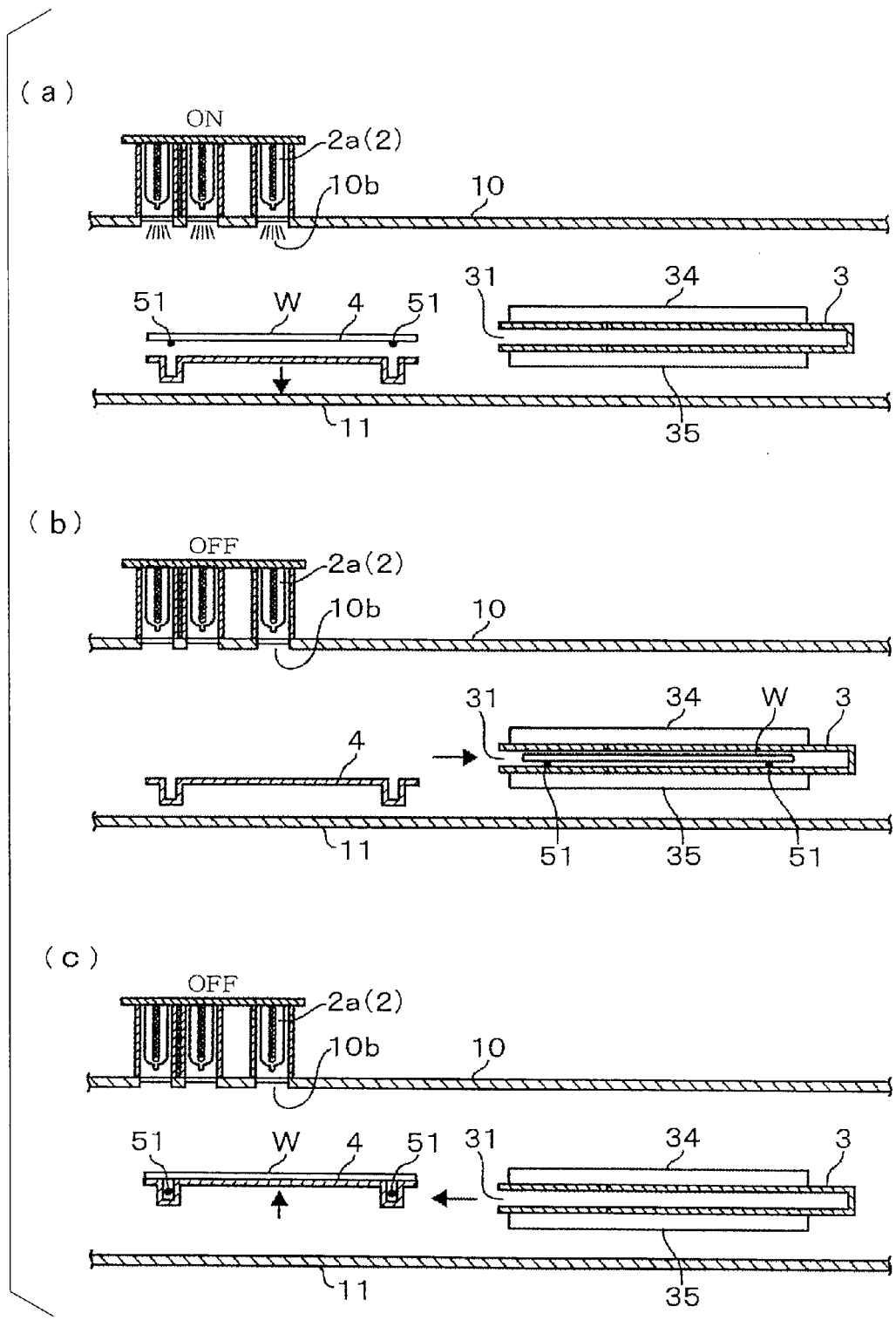
FIGS. 7A to 7C are views of assistance in explaining functions of the heating device shown in FIG. 1.

As shown in FIG. 6, the heating lamps 2, for example, seventeen heating lamps 2, are arranged in four rows in an area corresponding to, for example, a rear half of the wafer W placed on the cooling plate 4. Intervals between the heating lamps 2 in the rows nearer to the rear end of the wafer W are shorter. When the wafer W held on the cooling plate 4 is exposed for a predetermined time to heat rays radiated by the heating lamps 2 thus arranged, roughly rear half part of the wafer W is irradiated with the heat rays such that heat ray density, namely, thermal energy density, is higher in parts of the wafer W nearer to the rear end of wafer W. Consequently, a temperature distribution, in which temperatures of parts of the wafer W nearer to the rear end of the wafer W are higher than those of parts of the wafer W nearer to the front end of the wafer W, is created in the surface of the wafer W. Such a temperature distribution will be referred to as a preheating temperature distribution. FIGS. 3 and 7 are typical views of the arrangement of the heating lamps 2 not exactly illustrating the actual arrangement of the heating lamps 2 shown in FIG. 6.

Preferably, the preheating temperature distribution created in the wafer W can cancel out difference in absorbed heat between the front and the rear end part of the wafer W resulting from the difference between the time the front end part of the wafer W is inserted into the heating chamber 3 and the time the rear end part of the wafer W is inserted into the heating chamber 3, and can narrow the range of an initial temperature distribution in the surface of the wafer W. It is desirable to design the arrangement of the heating lamp 2 by the following procedure. Quantities of heat that may be absorbed, respectively, by parts of a wafer W when the wafer W is inserted into the heating chamber 3 without being heated by the heating lamps 2, and an initial temperature distribution are estimated by experiments or simulation. A quantity of heat to be given to the wafer W to create a flat initial temperature distribution is calculated. An area in which the heating lamps 2 are to be arranged, intervals between the heating lamps 2, and the respective heating capacities of the heating lamps 2 are determined on the basis of data obtained by experiments or simulation, and calculation such that the range of the initial temperature distribution is narrowed. In FIG. 6, the heating lamps are arranged in only an area corresponding to the rear half of the wafer W, it goes without saying that heating lamps 2 of a small heating capacity may be arranged also in an area corresponding to the front half of the wafer W.

As shown in FIG. 3, a power supply unit 23 is connected to the heating lamps 2. The power supply unit 23 is controlled by the controller 7. Operations of the power supply unit 23 for supplying power and stopping supplying power to the heating lamps 2 are timed by the controller 7. Functions of the heating lamps 2 will be described.

FIG. 7 is a longitudinal sectional view typically illustrating the relation between the position of a wafer W before and after being carried into the heating chamber 3, and the operation of the heating device 1. For example, a wafer W is carried by a wafer carrying mechanism provided with a U-shaped carrying member to and transferred to the cooling plate 4 at the waiting position. The wafer W is held on the cooling plate 4. Then, as shown in FIG. 7A, the cooling plate 4 is lowered to support the wafer W on the wires 51, and the heating lamps 2 are turned on to heat the wafer W for a predetermined time between 1 and 3 s with heat rays so as to create a preheating temperature distribution in the surface of the wafer W held on the cooling plate 4. The preheating temperature distribution is created after the wafer W has been transferred from the cooling plate 4 to the wires 51 to reduce heat loss. Naturally, the wafer W held on the cooling plate 4 may be heated to create a preheating temperature distribution in the surface of the wafer w.

Then, as shown in FIG. 7B, the heating lamps 2 are turned off, and the wires 51 carry the wafer W into the heating chamber 3. The front end of the wafer W enters the heating chamber first. The wafer W is heated in a preheating temperature distribution such that parts thereof nearer to the rear end thereof are higher than those of parts nearer to the front end thereof. The preheating temperature distribution cancels out differences in temperature between parts of the wafer W resulting from differences in the time the parts enter the heating chamber 3. Therefore, the temperature difference between a front part of the wafer W absorbed a comparatively large quantity of heat, and a rear part absorbed a comparatively small quantity of heat can be reduced after the wafer W has been entirely carried into the heating chamber 3.

The interior of the heating chamber 3 is heated, for example, at 130° C. by the heating plates 34 and 35 contiguous respectively with the upper and the lower surface of the heating chamber 3 when the wafer W is carried into the heating chamber 3. The wafer W is supported on the wires 51 in a space between the heating plates 34 and 35 in the heating chamber 3 so that the wafer W may not touch either of the heating plates 34 and 35. After the completion of an operation for carrying the wafer W into the heating chamber 3, the valve V1 is opened to blow the purging gas heated at the same temperature as the interior of the heating chamber 3 is blown through the gas blowing duct 12 into the heating chamber 3 and, at the same time, the valve V2 is opened and the fan 62 is operated to suck out the gas from the heating chamber 3. Consequently, unidirectional currents are produced over and under the wafer W as indicated by the arrows in FIG. 5. A chemically amplified resist film coating the wafer W, heated in a flat initial temperature distribution curve, and processed by an exposure process is heated by the PEB process using heat radiated by the heating plates 34 and 35 and heat transferred thereto by the convection of the gas. After the purging gas has been supplied, for example, for a predetermined time, the supply and the discharge of the purging gas are stopped to terminate the PEB process.

After the termination of the PEB process, the operations for carrying the wafer W into the heating chamber 3 are reversed to transfer the wafer W from the wires 51 to the cooling plate 4 to cool the wafer W roughly. Then, the wafer W is transferred from the cooling plate 4 to the external carrying mechanism, and the external carrying mechanism carries the wafer out of the processing vessel 10 to terminate processing the wafer W by the heating device 1.

The heating device in this embodiment has the following effects. Since a wafer W preheated in a preheating temperature distribution is carried into the heating chamber 3, and then the heating process for heating the entire wafer W is started, the range of an initial temperature distribution resulting from the difference between the time a front end part of the wafer W is inserted into the heating chamber 3 and the time a rear end part of the wafer W is inserted into the heating chamber 3 can be narrowed, and the wafer W can be processed by the heating process in a high intrasurface uniformity. Consequently, the resist film processed by the PEB process can be developed in a resist pattern of lines having uniform width, which contributes to the improvement of the quality and yield of products.

The heating lamps 2 as temperature distribution creating means can heat a wafer W quickly. Therefore, the additional process of creating a preheating temperature distribution does not significantly affect overall processing time needed by the heating device 1. Since the heating lamps 2 are arranged in an area corresponding to the rear half of the wafer W and the heating lamps 2 are surrounded by the reflecting cases 21, respectively, heat loss resulting from irradiating the front half of the wafer W, and devices disposed in the heating device 1 and not needing heating with heat rays can be reduced, and the wafer can be efficiently heated to create a necessary preheating temperature distribution.

Figure 8:
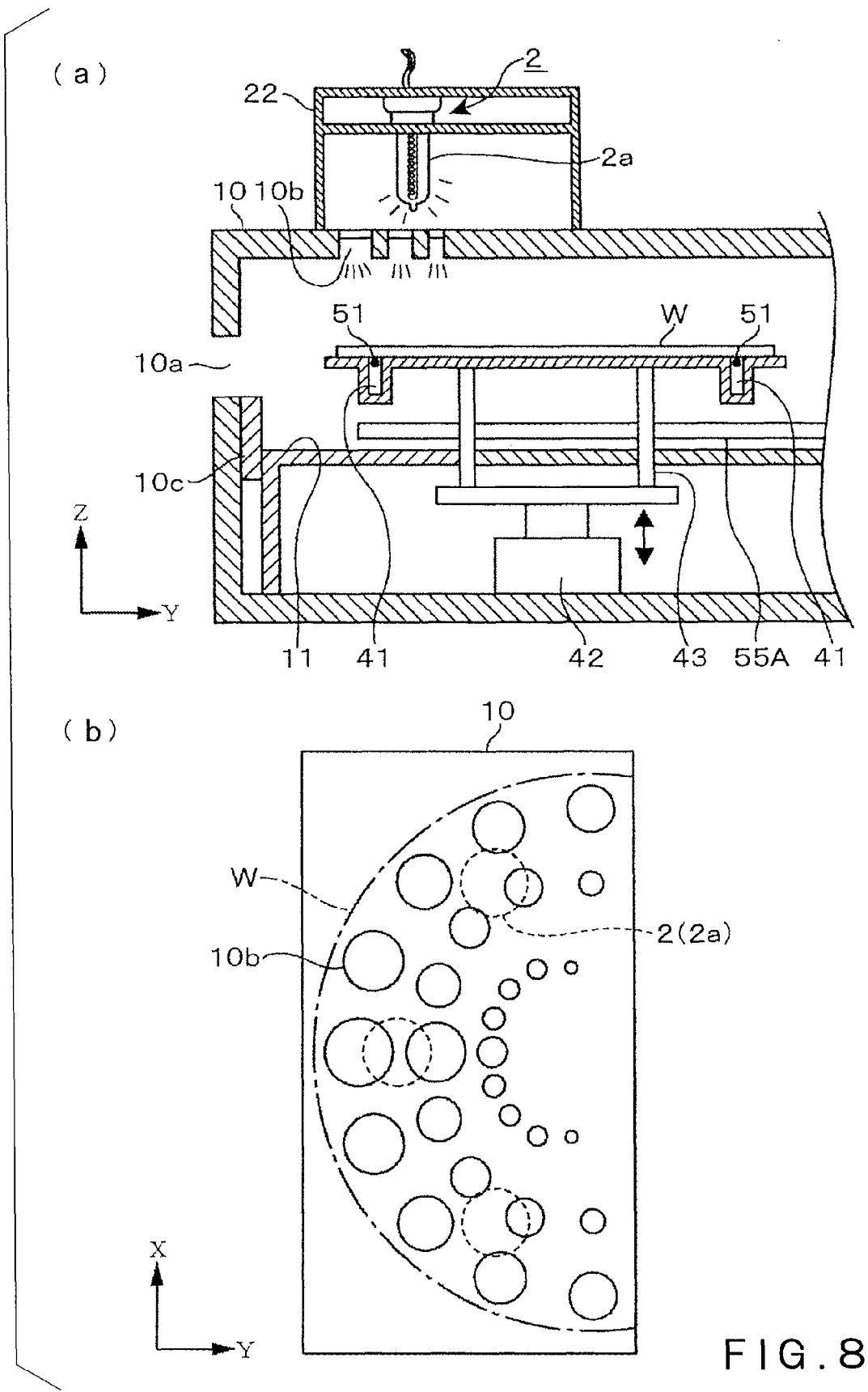
FIGS. 8A and 8B are views of assistance in explaining another arrangement of heating lamps.

The method of creating a desired preheating temperature distribution by the heating lamps 2 is not limited to the method that properly adjust the intervals between the heating lamps 2 described above with reference to FIG. 6. For example, a luminous intensity distribution pattern control member for controlling a luminous intensity distribution pattern of radiations radiated by the heating lamp 2 on the wafer W may be used. For example, a luminous intensity distribution control member provided with larger openings 10b in parts thereof corresponding to parts of a wafer W placed on the cooling plate 4 nearer to the rear end of the wafer W, and smaller openings 10b in parts thereof corresponding to parts of the wafer W nearer to the front end of the wafer W as shown may be disposed between the heating lamps 2 and the wafer W placed on the cooling plate 4 as shown in FIG. 8A. In this embodiment, a part of the top wall of the processing vessel corresponds to such a luminous intensity distribution control member. The fixed base 22 may be entirely covered with a reflecting member, and only three heating lamps 2 may be held on the fixed base 22 as indicate by broken lines in FIG. 8B. The pattern of distribution of heat rays radiated by the three heating lamps 2 is controlled by the openings 10b respectively having different sizes such that parts of the wafer W nearer to the rear end of the wafer W are irradiated with the heat rays in higher energy densities. This luminous intensity distribution control method using the luminous intensity distribution control member can control the preheating temperature distribution more flexibly than the method resorting to the adjustment of intervals between the heating lamps 2 to control luminous intensity distribution.

Heating lamps 2 respectively having different heating capacities may be arranged as shown in FIG. 6 such that the heating lamps 2 having higher heating capacities are arranged in areas corresponding to parts of the wafer W nearer to the rear end of the wafer W. The heating lamps 2 may be turned on and off at different time points so that period in which the heating lamps 2 corresponding to parts of the wafer W nearer to the front end of the wafer W radiate heat rays are shorter. The shape of the luminous intensity distribution control member is not limited to that of the luminous intensity distribution control member shown in FIG. 8. Adjustable Venetian blinds having slats may be used instead of the transparent plates 24, and the angles of the slats may be adjusted such that the heat rays fall on the wafer in higher energy densities on parts of a wafer W nearer to the rear end of the wafer W. Two or more foregoing methods may be used in combination.

Figure 9:
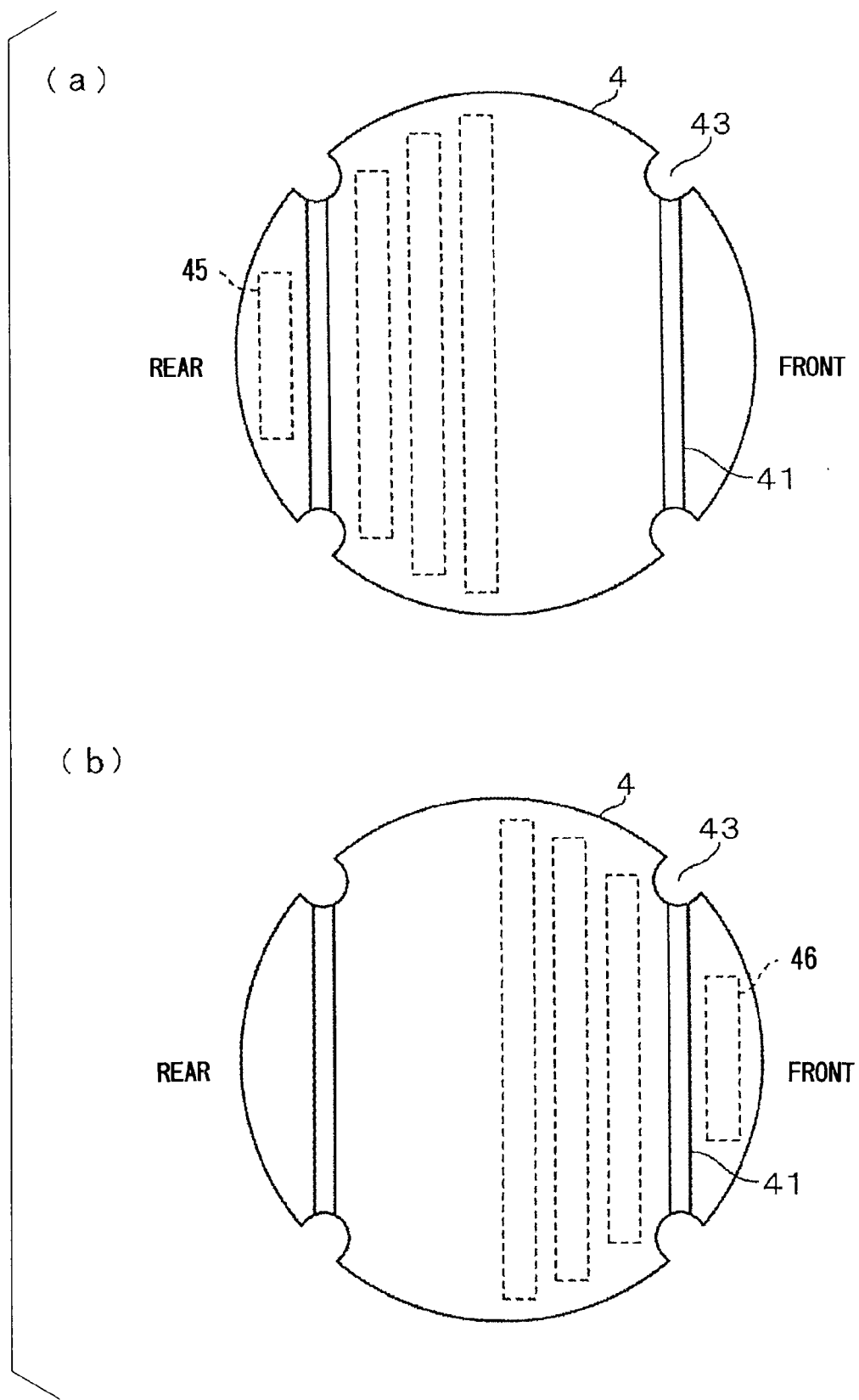
FIGS. 9A and 9B are plan views of other temperature distribution creating member.

The preheating temperature distribution creating means is not limited to the heating lamp 2 that radiate heat rays. For example, heating elements 45 may be embedded in a part of the cooling plate 4 corresponding to the rear half of a wafer W as shown in FIG. 9A to heat the parts provided with the heating elements 45 of the cooling plate 4 to heat a wafer W in a preheating temperature distribution in which temperatures of parts of the wafer W nearer to the rear end of the wafer W are higher than those of parts of the wafer W nearer to the front end of the wafer W. Peltier elements 46 may be embedded in a part of the cooling plate 4 corresponding to the front half of a wafer W as shown in FIG. 9B to cool the parts provided with the Peltier elements 46 of the cooling plate 4 to cool a wafer W in a preheating temperature distribution in which temperatures of parts of the wafer W nearer to the rear end of the wafer W are higher than those of parts of the wafer W nearer to the front end of the wafer W. All those methods enable forming the heating device 1 in a low height. A desired preheating temperature distribution may be created by blowing hot air against a rear end part of the wafer W or by blowing cold air against a front end part of the wafer W.

The heating device 1 in this embodiment uses the wires 51A and 51B extended in the direction intersecting the carrying passage along which a wafer W is carried as the carrying means for carrying a wafer W. The carrying means may be other than the wires 51A and 51B. For example, the carrying means may include pulleys disposed near the opposite ends of the carrying passage, and a plurality of wires extended parallel to the carrying passage and wound round the pulleys. The wires are moved by the pulleys to carry a wafer W. When this carrying means is employed, grooves are formed in the cooling plate 4 along the wires parallel to the carrying direction.

Figure 10:
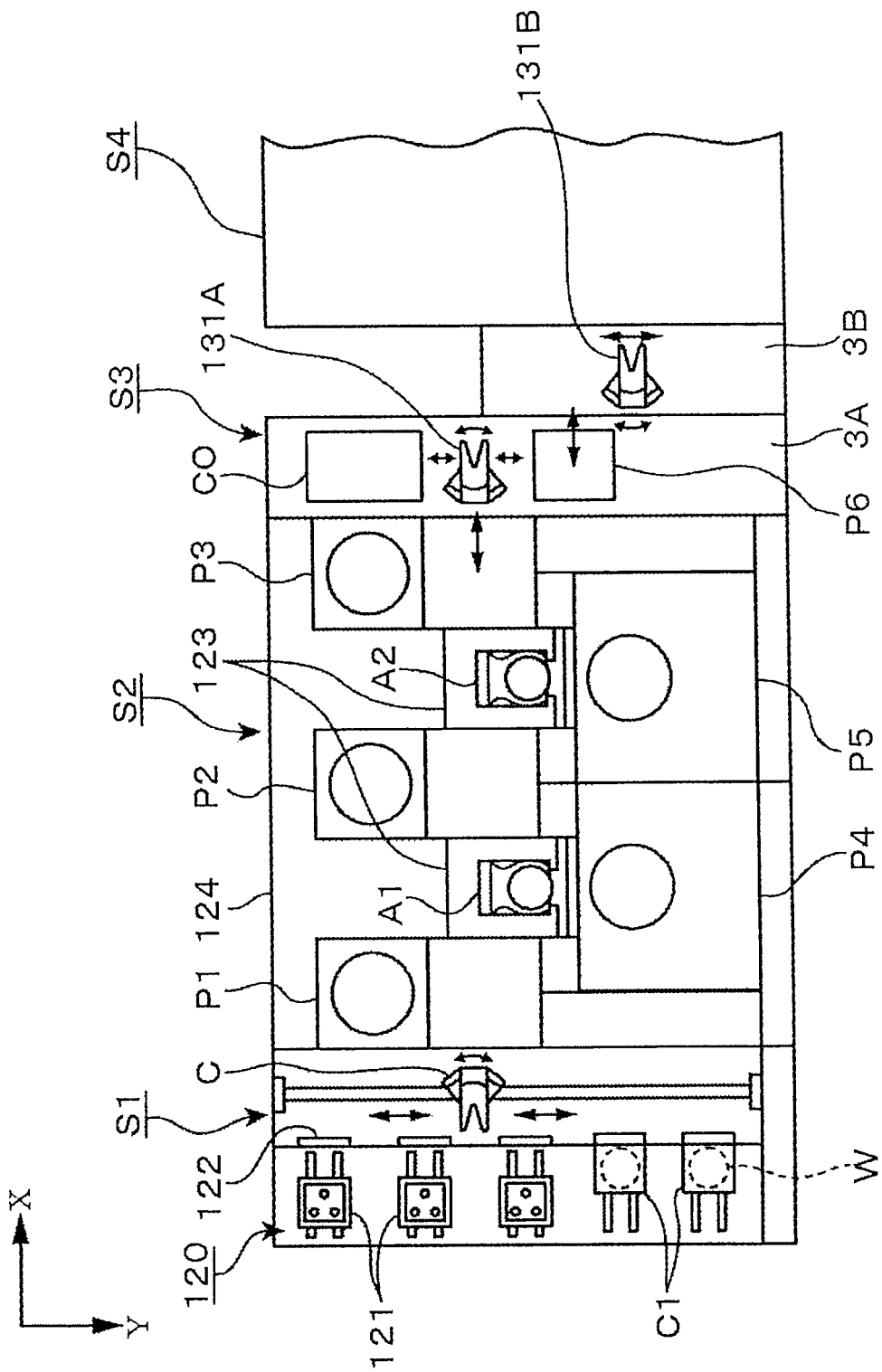
FIG. 10 is a plan view of a coating and developing system to which the heating device of the present invention is applied.
Figure 11:
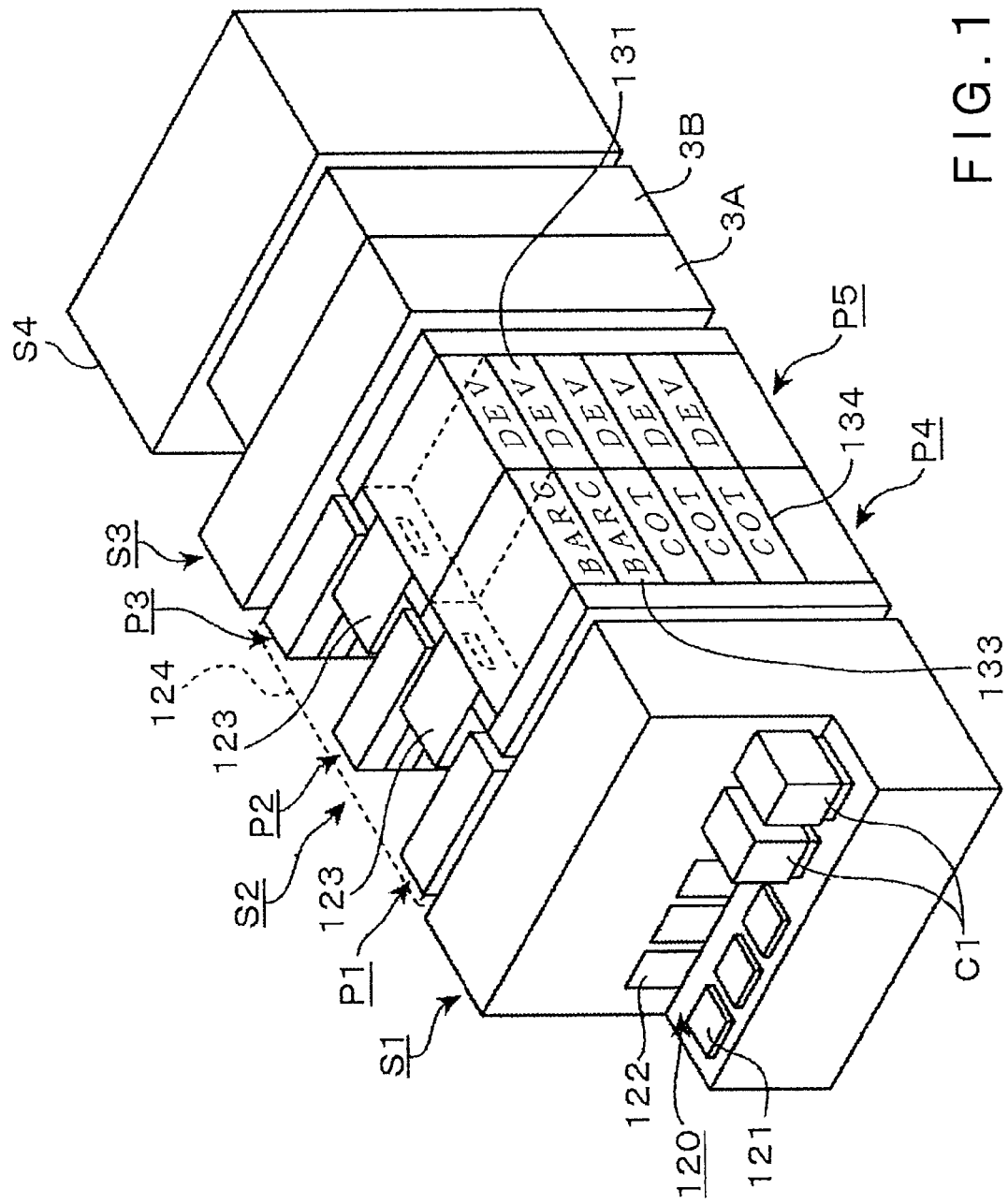
FIG. 11 is a perspective view of the coating and developing system shown in FIG. 10.

A coating and developing system provided with the heating device 1 will be described. FIGS. 10 and 11 are a plan view and a perspective view, respectively, of the coating and developing system. A carrier block S1 has a carrier station 120, for receiving a carrier C1 containing, for example, thirteen wafers W, provided with carrier tables 121 on which carriers Cl are placed, closable openings 122 closed by doors and formed in a wall on the front side of the carrier station 120, and a transfer arm C for taking out a wafer W from the carrier Cl through the closable opening 122.

A processing block S2 surrounded by a box 124 is joined to the inner end of the carrier block S1. The processing block S2 includes shelf units P1, P2 and P3 each formed by stacking up heating and cooling modules in layers, wet-processing units P4 and P5, and main arms A1 and A2, namely, carrying means. The shelf units P1, P2 and P3, and the main arms A1 and A2 are arranged alternately. The main arms A1 and A2 carry wafers W from one to another of those modules. Each of the main arms A1 and A2 is disposed in a space 123 surrounded by the side walls of the adjacent ones of the shelf units P1, P2 and P3, the inner side wall of the corresponding one of the wet-processing units P4 and P5, and a rear wall extending between the adjacent ones of the shelf units P1, P2 and P3.

The shelf units P1, P2 and P3 are formed by stacking in layers pretreatment modules for pretreating a wafer W before the wafer W is processed by the wet-processing units P4 and P5, and posttreatment units for posttreating a wafer W processed by the wet-processing unit P4 and P5. The stacked modules include heating modules PAB for processing a wafer W by a baking process, and cooling modules for cooling a wafer W. The heating device 1 of the present invention is incorporated into the shelf unit P3.

The wet-processing units P4 and P5 are mounted on chemical solution storage units for storing a resist solution and a developer. The wet-processing unit P4 is formed by stacking antireflection film applying modules 133 and resist solution applying modules 134 in, for example, five layers. The wet-processing unit P5 is formed by stacking developing modules 131 in, for example, five layers.

An interface block S3 has a first carrying chamber 3A and a second carrying chamber 3B longitudinally arranged between the processing block and an exposure system S4. Wafer carrying mechanisms 131A and 131B are installed in the first carrying chamber 3A and the second carrying chamber 3B, respectively. The wafer carrying mechanisms 131A and 131B are vertically and horizontally movable and turnable about a vertical axis.

A shelf unit P6 and a buffer cassette CO are installed in the first carrying chamber 3A. The shelf unit P6 is formed by stacking transfer stages (TRS) and precision temperature adjusting modules. A wafer is transferred between the wafer carrying mechanism 131A and 131B through the transfer stage. The precision temperature adjusting module is provided with a cooling plate for adjusting the temperature of a wafer W to a desired temperature before sending the wafer W to the exposure system S4.

The flow of a wafer W in the coating and developing system will be described. A carrier Cl containing wafers W is delivered from an external system to the carrier block S1. Then, a wafer W is carried along a route passing the transfer arm C, the transfer stage (TRS) of the shelf unit P1, the carrying mechanism A1, the lower antireflection film forming module (BARC) 133, the carrying mechanism A1 (A2), the heating module, the carrying mechanism A1 (A2), the cooling module, the carrying mechanism A1 (A2), the resist solution application module (COT) 134, the carrying mechanism A1 (A2), the heating module, the carrying mechanism A1 (A2), the cooling module, the carrying mechanism A2, the transfer stage (TRS) of the shelf unit P3, the wafer carrying mechanism 131A, the transfer stage (TRS) of the shelf unit P6, the temperature adjusting module of the shelf unit P6, the wafer carrying mechanism 131B, and the exposure system S4.

The wafer W processed by an exposure process is carried along a route passing the wafer carrying mechanism 131B, the transfer stage (TRS) of the shelf unit P6, the wafer carrying mechanism 131A, the transfer stage (TRS) of the shelf unit P3, the heating device 1 (PEB) of the shelf unit P3, the carrying mechanism A2, the developing module 131, the carrying mechanism A1, the transfer stage (TRS) of the shelf unit P1, and the transfer arm C. Then, the transfer arm C returns the processed wafer W into the carrier Cl to terminate the coating and developing process.

EXAMPLES

Experiment

Figure 12:
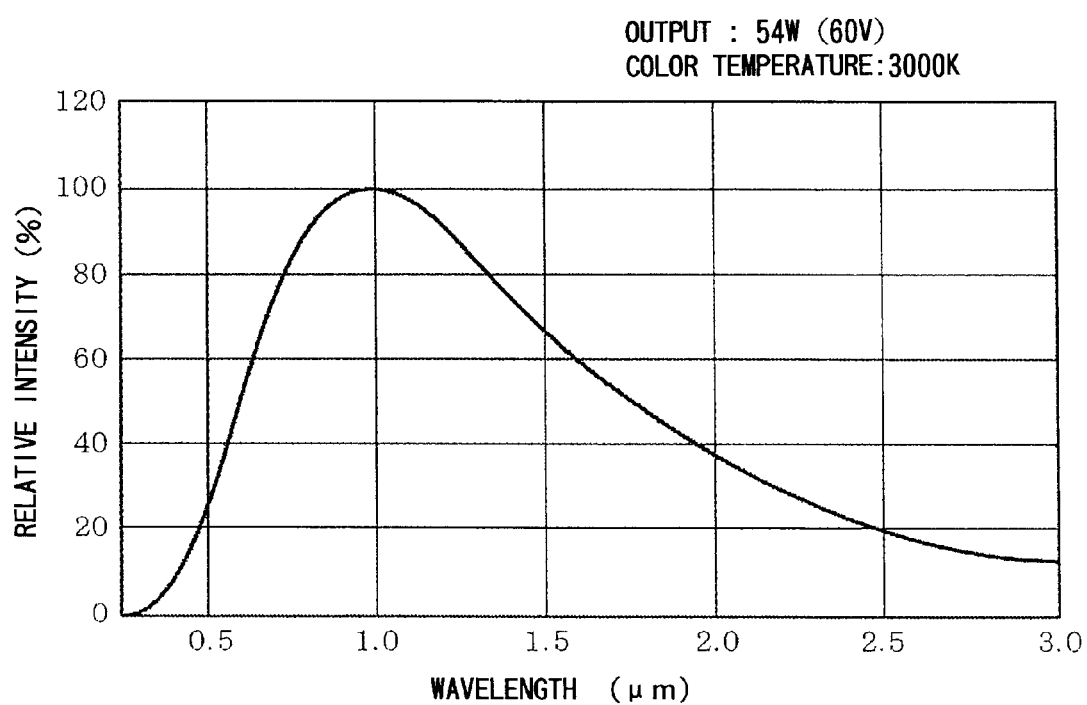
FIG. 12 is a graph showing the distribution of relative luminous intensities of radiations of wavelengths emitted by the heating lamps.

A wafer W was heated by a heating device 1 substantially the same as the heating device 1 described above with reference to FIGS. 1 to 6 to verify the effect of creating a preheating temperature distribution. The heating device 1 was provided with infrared lamps of 54 W (60 V) having a color temperature of 3000 K as heating lamps 2. FIG. 12 shows a relative intensity distribution curve indicating relative intensities as a function of wavelength of radiation radiated by the heating lamps 2. The number and arrangement of the heating lamps 2 were the same as those mentioned with reference to FIG. 6. The distance between each of the heating lamps 2 and a wafer W placed on the cooling plate 4 was 25 mm. All the openings 10b were formed in a diameter of 30 mm. The transparent plates 24 were not used.

Example

A 12 in. diameter wafer W was irradiated with heat rays radiated by the heating lamps 2 for 3 s to create a preheating temperature distribution in the wafer W. Then, the wafer W was carried into the heating chamber 3 heated at 130° C. Temperatures distributed in the surface of the wafer W and variation of the temperatures of parts of the surface of the wafer were measured.

Comparative Example

A wafer in a comparative example was heated in the same manner by the heating device 1 without creating any preheating temperature distribution in the wafer W.

Figure 13:
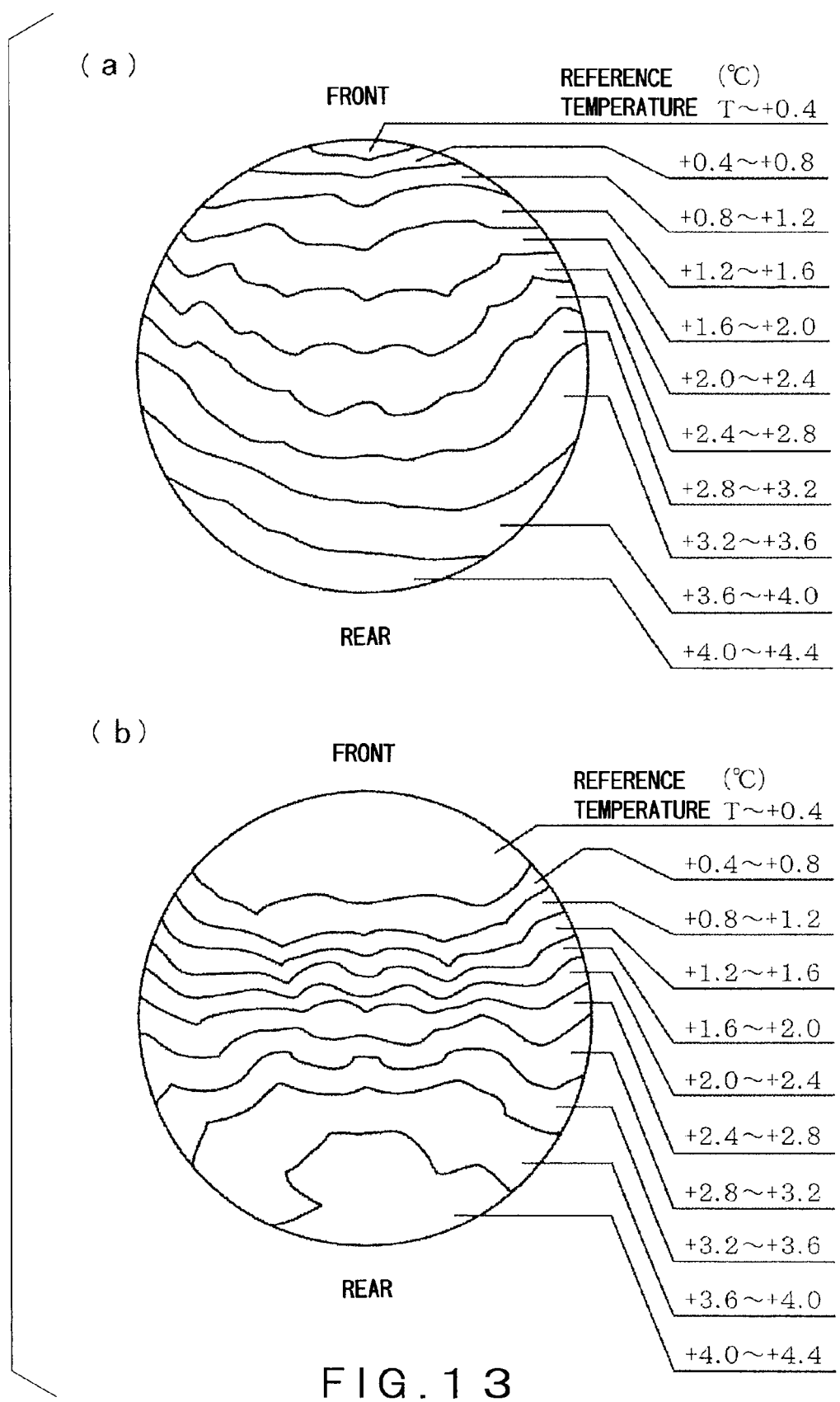
FIGS. 13A and 13B are diagrammatic views respectively showing a simulated preheating temperature distribution and an experimental preheating temperature distribution.

FIG. 13A shows a simulated preheating temperature distribution to be created in the wafer W before carrying the wafer W into the heating chamber 3 to create a uniform initial temperature distribution in the wafer W immediately after the wafer W has been carried into the heating chamber 3. In FIG. 13A, the leading and the rear end of the wafer W with respect to a carrying direction toward the heating chamber 3 are on the upper and the lower side, respectively. A temperature distribution in a surface on which a resist film is formed is represented by isothermal lines. The isothermal lines indicate relative temperatures relative to a reference temperature T at intervals of 0.4° C. Temperatures of areas each extending between the adjacent isothermal lines are in temperature ranges indicated on the right-hand side of FIG. 12A. Simulation showed that it is preferable to create a preheating temperature distribution in which the temperature rises gradually toward the rear end of the wafer W to create a uniform initial temperature distribution.

FIG. 13B shows an experimental preheating temperature distribution created by an experiment in the surface of a wafer W by the heating lamps 2 of the heating device. Radiant flux supplied by the seventeen heating lamps 2 was 918 W. Radiant exposure on the 12 in. diameter wafer W was 2.6 W/cm$^2$, and the quantity of energy supplied in 3 s to the wafer W was 7.8 J/cm$^2$. The direction of the wafer W and the representation of a temperature distribution in the wafer W are the same as those shown in FIG. 13A. Experiments showed that a preheating temperature distribution in which temperature of the surface of the wafer W increased toward the rear end of the wafer W could be created by the lamps 2 of the heating device in the embodiment. In the experimental preheating temperature distribution shown in FIG. 13B, a low-temperature area in a front end part of the wafer, and a high-temperature area in a rear end part of the wafer W are wide as compared with those in the simulated preheating temperature distribution shown in FIG. 13A. It is conjectured that such a preheating temperature distribution was created because the heating lamps 2 were arranged in the area corresponding to the rear half of the wafer W such that intervals between the heating lamps nearer to the rear end of the area corresponding to the rear end of the wafer are shorter.

Figure 14:
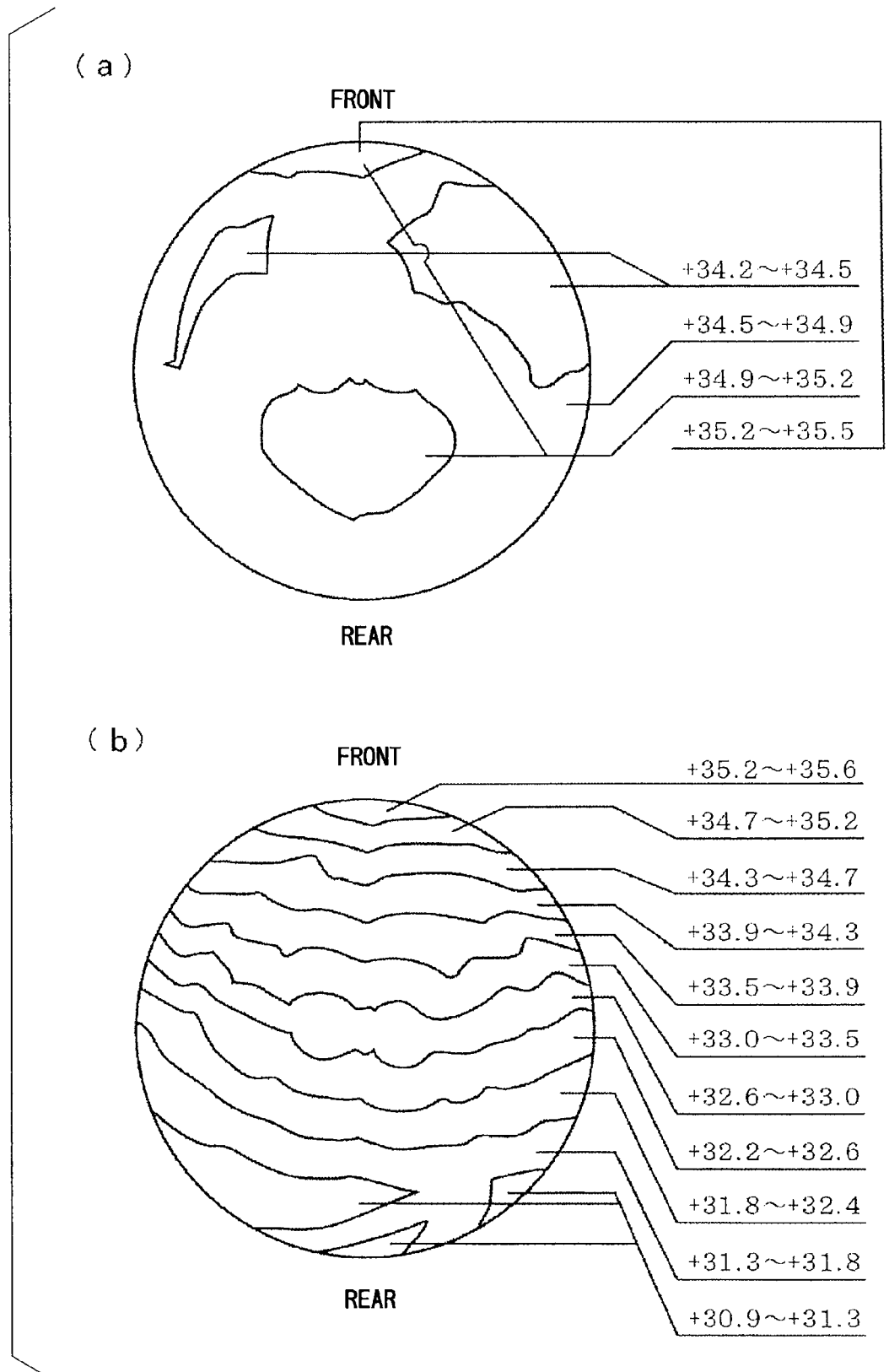
FIGS. 14A and 14B are diagrammatic views respectively showing an initial temperature distribution in a surface of a wafer in an example, and an initial temperature distribution in a surface of a wafer in a comparative example.
Figure 15:
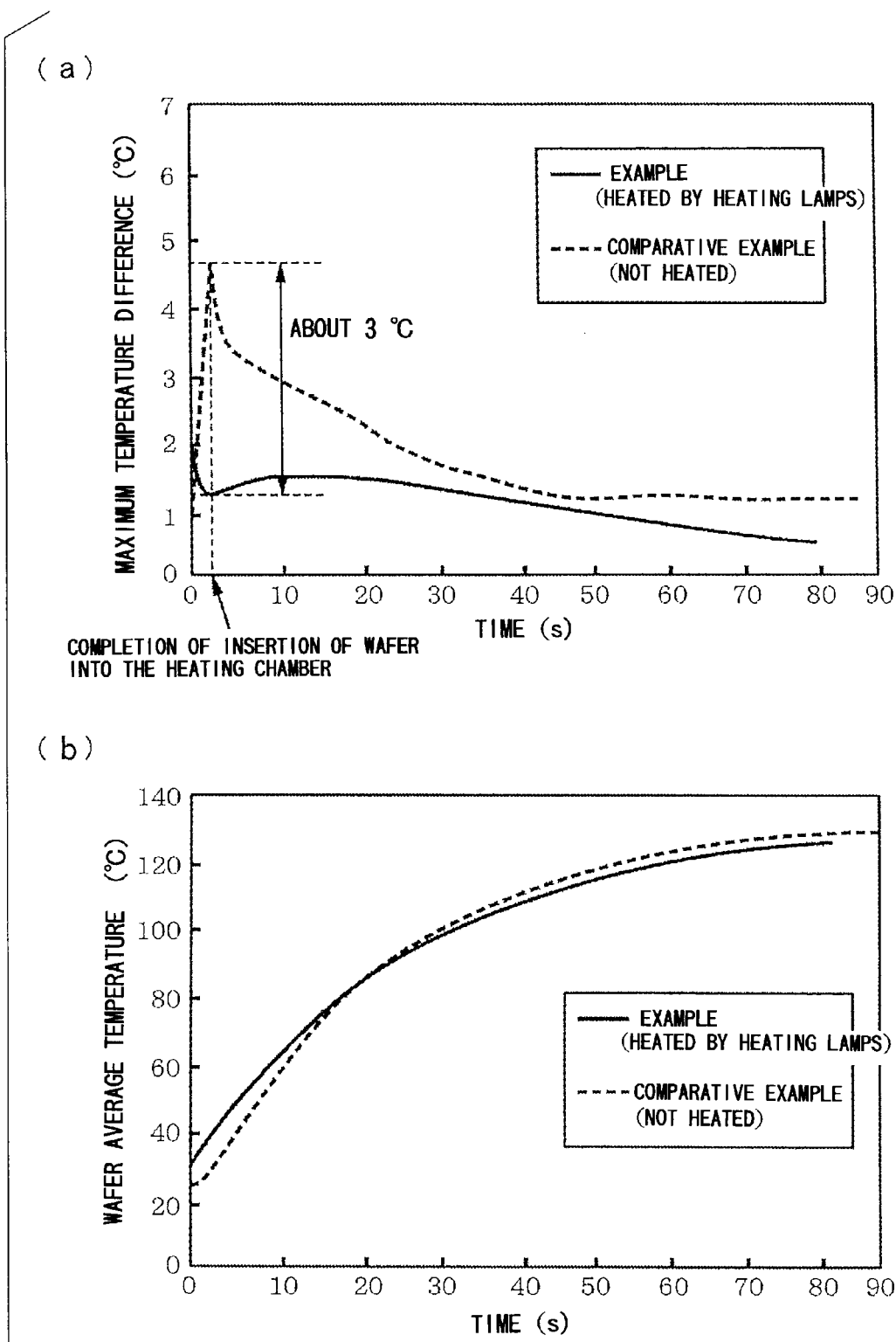
FIGS. 15A and 15B are graphs showing the variation of the maximum temperature difference in surfaces of wafers in an example and a comparative example, and the variation with time of the mean temperatures of wafers in an example and a comparative example, respectively.
Figure 16:
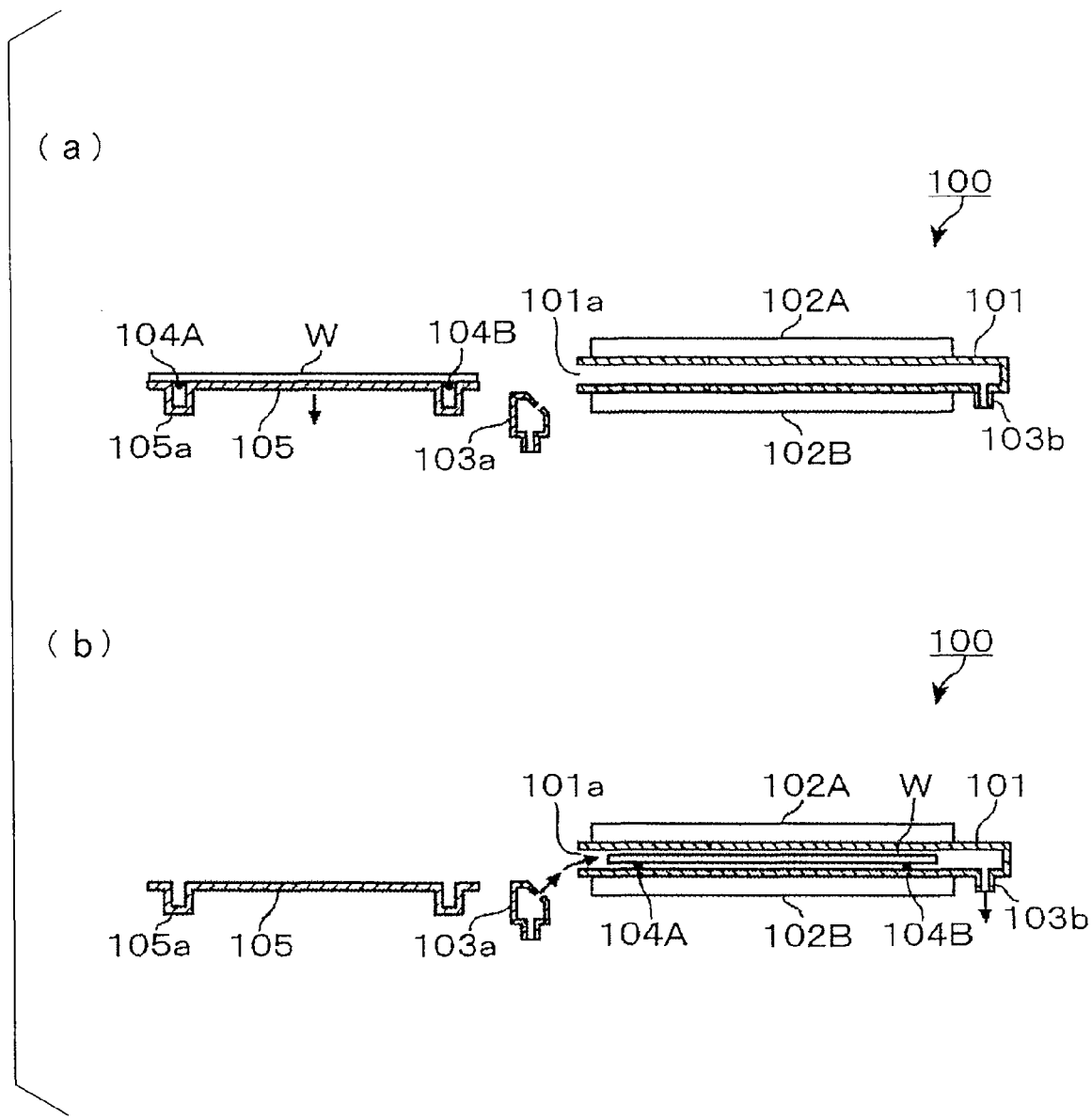
FIG. 16 is a longitudinal sectional view of a conventional heating device.

FIGS. 14 and 15 show results of experiments of an example and a comparative example. FIGS. 14A and 14B are views respectively showing an initial temperature distribution created in a surface of a wafer by the example, and an initial temperature distribution created by the comparative example in a surface of a wafer. FIGS. 15A and 15B are graphs showing the variation of temperature difference in surfaces of wafers processed by the example and the comparative example, and the variation with time of the mean temperatures of wafers processed by the example and the comparative example, respectively.

FIG. 14A shows an initial temperature distribution in a surface of a wafer created by the example. Indication of the direction of the wafer W in FIG. 14A is the same as that in FIG. 13A. Isothermal lines indicate measured temperatures. Results of experiments showed that temperature differences of most parts of the surface of the wafer W excluding those of front end parts of the wafer W are about 1.3° C. or below and a flat initial temperature distribution was created when the wafer W heated in the preheating temperature distribution shown in FIG. 13B was carried into the heating chamber 3.

An initial temperature distribution in which the temperature of the surface of the wafer decreased gradually toward the rear end of the wafer W as shown in FIG. 14B was created in the wafer W processed by the comparative example. Temperature differences of parts of the surface of the wafer W are as large as about 4.7° C. or below, which is large as compared with that in the example. Results of experiments proved that a flat initial temperature distribution can be created in the surface of the wafer W by previously creating a satisfactory preheating temperature distribution in the surface of the wafer W.

FIG. 15A shows the variation of the maximum temperature difference in the surfaces of wafers W in an example and a comparative example. In FIG. 15A, a solid curve and a broken curve are for the example and the comparative example, respectively. The maximum temperature difference in the example is about 2.5° C. at a time point 0 immediately before starting carrying the wafer W into the heating chamber 3. Upon the complete insertion of the wafer W into the heating chamber 3, the maximum temperature difference dropped to about 1.3° C. and dropped to 1° C. in, for example, 80 s. In the comparative example, the maximum temperature difference increased sharply to about 4.7° C. when the wafer W was carried into the heating chamber 3 and decreased gradually. However, the maximum temperature difference did not drop to 1° C. or below in 80 s. Experiments proved that the range of the initial temperature distribution in the example was narrower by about 3° C. than that in the comparative example.

FIG. 15B shows the variation with time of the mean temperatures of wafers W in the example and the comparative example. There is no significant difference in the respective means temperatures of the example and the comparative example at a time point, for example, at 80 s after the insertion of the wafer W into the heating chamber. It is known from FIG. 15B that the entire wafer W can be heated at a desired temperature even if a preheating temperature distribution is created in the wafer W.

Although the invention has been described in its preferred embodiments with a certain degree of particularity, obviously many changes and variations are possible therein. It is therefore to be understood that the present invention may be practiced otherwise than as specifically described herein without departing from the scope and spirit thereof.

What is claimed is:

1. A heating device comprising:
a heating chamber contained in a processing vessel for heating and processing, and provided with heating plates for heating a substrate;
a carrier device which transversely carries a substrate placed at a waiting position positioned at a neighboring side of the heating chamber and outside the heating chamber into the heating chamber in the processing vessel, the carrier device carrying the substrate in a direction from a front end of the substrate to a rear end of the substrate, the carrier device being contained in the processing vessel for heating and processing; and
a temperature distribution creation device which creates a preheating temperature distribution for compensating an initial temperature distribution occurring in a surface of the substrate when the substrate is carried into the heating chamber from the waiting position,
wherein the temperature distribution creation device creates a preheating temperature distribution in which temperatures of parts of the substrate nearer to the rear end of the substrate are higher than that of the front end of the substrate.

2. The heating device according to claim 1, wherein the temperature distribution creation device creates the preheating temperature distribution by heating a rear part of the substrate with respect to the carrying direction.

3. The heating device according to claim 2, wherein the temperature distribution creation device includes heating lamps.

4. The heating device according to claim 3, wherein the temperature distribution creation device further includes a luminous intensity distribution control member disposed between an array of the heating lamps and the waiting position.

5. The heating device according to claim 2, further comprising a substrate support plate at the waiting position behind the heating chamber with respect to the carrying direction in which the substrate is carried, wherein the temperature distribution creation device is incorporated into the substrate support plate.

6. The heating device according to claim 5, wherein the temperature distribution creation device includes resistance heating elements.

7. The heating device according to claim 1, wherein the temperature distribution creation device creates the preheating temperature distribution by cooling a front part of the substrate, with respect to the carrying direction.

8. The heating device according to claim 7, further comprising a substrate support plate at the waiting position behind the heating chamber with respect to a carrying direction in which the substrate is carried into the heating chamber, wherein the temperature distribution creation device is incorporated into the substrate support plate.

9. The heating device according to claim 1, further comprising a cooling plate for cooling the substrate after the substrate has been processed by a heating process, wherein the waiting position is on the cooling plate.

10. The heating device according to claim 5, wherein the substrate support plate has a cooling function of a cooling plate.

11. The heating device according to claim 1, wherein the carrier device includes a plurality of wires extended so as to intersect a carrying passage parallel to the carrying direction or so as to be parallel to the carrying passage.

12. A coating and developing system comprising:
a carrier block to which a carrier containing substrates is delivered;
a processing block including a coating module for coating a surface of a substrate taken out of the carrier with a chemically amplified resist, a heating module for processing the substrate processed by an exposure process by a heating process, and a developing module for processing the substrate processed by the heating process by a developing process; and
an interface block through which the substrate is transferred between the processing block and an exposure system;
wherein the heating module is provided with the heating device set forth in claim 1.

13. A heating method comprising:
a heating step of heating a substrate by heating plates in a heating chamber formed in a processing vessel for heating processing;
a carrying step of transversely carrying the substrate placed at a waiting position positioned at a neighboring side of the heating chamber and outside the heating chamber in a carrying direction into the heating chamber, a carrier device carrying the substrate in a direction from a front end of the substrate to a rear end of the substrate, the carrier device being contained in the processing vessel for heating processing; and
a preheating temperature distribution creating step of creating a preheating temperature distribution in a surface of the substrate placed at the waiting position so as to compensate an initial temperature distribution that occurs in the surface of the substrate occurring immediately after the substrate has been carried into the heating chamber from the waiting position,
wherein the preheating temperature distribution is created as that temperatures of parts of the substrate nearer to the rear end of the substrate are higher than that of the front end of the substrate.

14. The heating method according to claim 13, wherein, in the preheating temperature distribution creating, the preheating temperature distribution is created by heating a rear part of the substrate with respect to the carrying direction.

15. The heating method according to claim 14, the preheating temperature distribution is created by irradiating the substrate with heating lamps.

16. The heating method according to claim 15, further comprising a luminous intensity distribution controlling step of controlling luminous intensity distribution in the surface of the substrate at a position between the heating lamps and the waiting position.

17. The heating method according to claim 13, wherein the preheating temperature distribution is created by a heater incorporated into a substrate support plate disposed at the waiting position behind the heating chamber with respect to the carrying direction.

18. The heating method according to claim 13, wherein, in he preheating temperature distribution creating step, the preheating temperature distribution is created by cooling a front part of the substrate with respect to the carrying direction.

19. The heating method according to claim 18, wherein the preheating temperature distribution is created by a cooling device incorporated into a substrate support plate disposed at the waiting position behind the heating chamber with respect to the carrying direction.

20. The heating method according to claim 13, further comprising a cooling step of cooling the substrate processed by the heating process and carried out of the heating chamber, wherein the cooling step is executed at the waiting position.

21. The heating method according to claim 13, wherein the carrying step of carrying the substrate into the heating chamber is achieved by a plurality of wires extended so as to intersect a carrying passage parallel to the carrying direction or so as to be parallel to the carrying passage.

22. A non-transitory storage medium storing a computer program to be executed by a heating device for heating a substrate by a heating plate; wherein the computer program specifies the steps of the heating method set forth in claim 13.

23. A heating device comprising:
a heating chamber contained in a processing vessel for heating processing, and provided with heating plates for heating a substrate;
a substrate carrier which carries a substrate placed at a waiting position positioned at a neighboring side of the heating chamber and outside the heating chamber into the heating chamber in the processing vessel, the substrate carrier to carry the substrate in a direction from a front end of the substrate to a rear end of the substrate, the substrate carrier contained in the processing vessel for heating processing; and
a preheater which compensates for an initial temperature distribution occurring in a surface of the substrate when the substrate is carried into the heating chamber from the waiting position,
wherein the preheater creates a preheating temperature distribution in which temperatures of parts of the substrate nearer to the rear end of the substrate are higher than that of the front end of the substrate.

\* \* \* \* \*